United States Patent
Cho et al.

(10) Patent No.: US 10,546,869 B2
(45) Date of Patent: Jan. 28, 2020

(54) SEMICONDUCTOR DEVICE

(71) Applicant: Samsung Electronics Co., Ltd., Suwon-si, Gyeonggi-do (KR)

(72) Inventors: Taekeun Cho, Seoul (KR); Hongsoo Kim, Seongnam-si (KR); Jong-Kook Park, Seoul (KR); TaeHee Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 15/800,545

(22) Filed: Nov. 1, 2017

(65) Prior Publication Data
US 2018/0261616 A1 Sep. 13, 2018

(30) Foreign Application Priority Data

Mar. 7, 2017 (KR) .................. 10-2017-0029010

(51) Int. Cl.
| | |
|---|---|
| *H01L 27/11573* | (2017.01) |
| *H01L 27/11519* | (2017.01) |
| *H01L 27/11529* | (2017.01) |
| *H01L 27/11524* | (2017.01) |
| *H01L 23/522* | (2006.01) |
| *H01L 27/11578* | (2017.01) |
| *H01L 27/11565* | (2017.01) |
| *H01L 27/11575* | (2017.01) |
| *H01L 27/11582* | (2017.01) |

(52) U.S. Cl.
CPC ...... *H01L 27/11573* (2013.01); *H01L 23/522* (2013.01); *H01L 27/11519* (2013.01); *H01L 27/11524* (2013.01); *H01L 27/11529* (2013.01); *H01L 27/11565* (2013.01); *H01L 27/11575* (2013.01); *H01L 27/11578* (2013.01); *H01L 27/11582* (2013.01)

(58) Field of Classification Search
CPC .................................................. H01L 27/11524
See application file for complete search history.

(56) References Cited

U.S. PATENT DOCUMENTS

| | | | |
|---|---|---|---|
| 7,804,716 | B2 | 9/2010 | Kwak et al. |
| 9,245,083 | B2 | 1/2016 | Lamorey et al. |
| 2009/0034336 | A1 | 2/2009 | Kwak et al. |
| 2015/0206835 | A1 | 7/2015 | Lamorey et al. |

(Continued)

FOREIGN PATENT DOCUMENTS

| | | |
|---|---|---|
| KR | 20070003338 | 1/2007 |
| KR | 20100021881 | 2/2010 |

*Primary Examiner* — Mounir S Amer
(74) *Attorney, Agent, or Firm* — Onello & Mello, LLP

(57) ABSTRACT

A semiconductor device comprises a plurality of stack structures that include gate electrodes sequentially stacked on a substrate and are disposed along a first direction, and a plurality of separating insulation layers each of which is disposed between the stack structures. A plurality of vertical pillars penetrate each of the stack structures and are connected to the substrate. A plurality of bit lines are disposed on the vertical pillars and run across the stack structures in the first direction. A plurality of bit line contact structures connect the vertical pillars to the bit lines. A plurality of first cell dummy lines are disposed on the plurality of separating insulation layers and extend in a second direction crossing the first direction.

18 Claims, 30 Drawing Sheets

(56) References Cited

U.S. PATENT DOCUMENTS

| | | | |
|---|---|---|---|
| 2015/0340377 A1* | 11/2015 | Lee | H01L 27/11582 257/314 |
| 2016/0055915 A1* | 2/2016 | Dong | G11C 16/0483 365/185.17 |
| 2016/0163635 A1 | 6/2016 | Yun et al. | |
| 2016/0268264 A1 | 9/2016 | Hwang et al. | |

* cited by examiner

SEMICONDUCTOR DEVICE

CROSS-REFERENCE TO RELATED APPLICATIONS

This U.S. nonprovisional patent application claims priority under 35 U.S.C § 119 of Korean Patent Application No. 10-2017-0029010 filed on Mar. 7, 2017 entire contents of which are hereby incorporated by reference.

BACKGROUND

1. Technical Field

The present inventive concept relates to a semiconductor device, and more particularly, to a three-dimensional semiconductor device having a plurality of three-dimensionally arranged memory cells.

2. Description of Related Art

A flash memory may comprise a memory array that includes non-volatile memory cells arranged in row and column fashion. The cells may be grouped into blocks. A NAND memory array may comprise a basic architecture of flash memory. A 3D NAND flash memory device may include a plurality of strings of charge storage devices stacked over one another. The charge storage devices of a respective string may share a common channel region, such as one formed in a respective pillar of semiconductor material. Each group of the plurality of strings may comprise a group of strings sharing a plurality of word lines. Each group of the plurality of strings may comprise a group of strings coupled by corresponding bit lines.

SUMMARY

According to exemplary embodiments of the present inventive concepts, a semiconductor device may comprise a plurality of stack structures that include gate electrodes sequentially stacked on a substrate and are disposed along a first direction, a plurality of separating insulation layers each of which is disposed between the stack structures; a plurality of vertical pillars that penetrate each of the stack structures and are connected to the substrate, a plurality of bit lines that are disposed on the vertical pillars and run across the stack structures in the first direction, a plurality of bit line contact structures that connect the vertical pillars to the bit lines, and a plurality of first cell dummy lines that are disposed on the plurality of separating insulation layers and extend in a second direction crossing the first direction.

According to exemplary embodiments of the present inventive concepts, a semiconductor device may comprise a substrate including a cell array region and a dummy region, a plurality of stack structures that include gate electrodes vertically stacked on the substrate, plurality of stack structures being disposed along the first direction and extending in a second direction crossing the first direction, a plurality of vertical pillars that penetrate each of the stack structures and are connected to the substrate, a plurality of bit lines running across the stack structures in the first direction, a plurality of bit line contact structures disposed on the vertical pillars penetrating the stack structures on the cell array region, and a plurality of cell dummy lines that are disposed between the stack structures and the bit lines in a cross-sectional view and constitute a grid structure while not overlapping the bit line contact structures in a plan view.

BRIEF DESCRIPTION OF THE DRAWINGS

FIGS. 10A to 15A are cross-sectional views corresponding to line I-I' of FIG. 3 illustrating a method of fabricating a semiconductor device according to exemplary embodiments of the present inventive concept.

FIGS. 10B to 15B are cross-sectional views corresponding to line II-II' of FIG. 3 according to an exemplary embodiment.

DETAILED DESCRIPTION OF EMBODIMENTS

Hereinafter, exemplary embodiments of the present inventive concepts will be described in detail in conjunction with the accompanying drawings.

Figure 1:
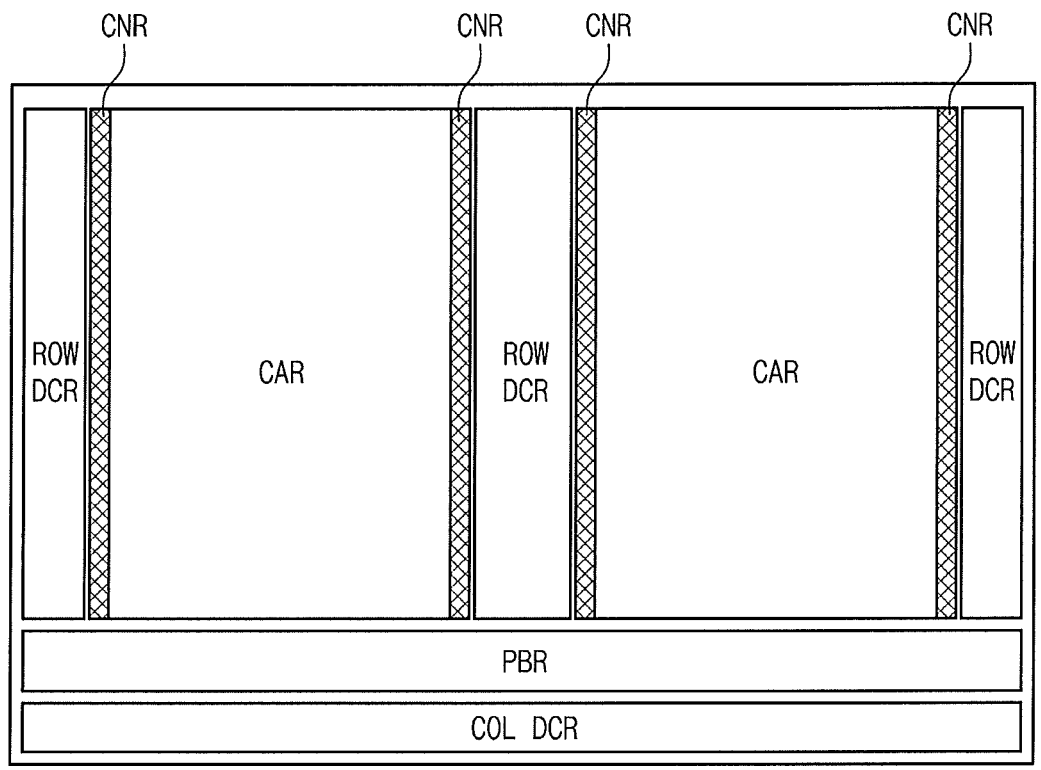
FIG. 1 is a schematic diagram illustrating a cell array region CAR and a peripheral circuit region in a semiconductor device according to exemplary embodiments of the present inventive concept.

FIG. 1 is a schematic diagram illustrating a semiconductor device according to exemplary embodiments of the present inventive concept.

Referring to FIG. 1, a semiconductor device may include a cell array region CAR and a peripheral circuit region. The peripheral circuit region may include row decoder regions ROW DCR, a page buffer region PBR, a column decoder region COL DCR, and a control circuit region. In some embodiments, a connection region CNR may be disposed between the cell array region CAR and each of the row decoder regions ROW DCR.

The cell array region CAR may include a memory cell array consisting of a plurality of memory cells. The memory cell array may include three-dimensionally arranged memory cells, a plurality of word lines electrically connected to the memory cells, and a plurality of bit lines electrically connected to the memory cells.

The row decoder region ROW DCR may be provided with a row decoder that selects the word lines of the memory cell array, and the connection region CNR may be provided with a routing structure that electrically connects the memory cell array and the row decoder to each other. The row decoder may select one of the word lines of the memory cell array in accordance with address information. The row decoder may provide word line voltages to the selected word line and unselected word lines in response to a control signal from a control circuit.

The page buffer region PBR may be provided with a page buffer that reads data stored in the memory cells. Depending on an operating mode, the page buffer may temporarily store data to be stored in the memory cells or sense data stored in the memory cells. The page buffer may function as a write driver in a program operating mode and as a sense amplifier in a read operating mode.

The column decoder region COL DCR may be provided with a column decoder connected to the bit lines of the memory cell array. The column decoder may provide a data transmission path between the page buffer and an external device (e.g., a memory controller).

Figure 2:
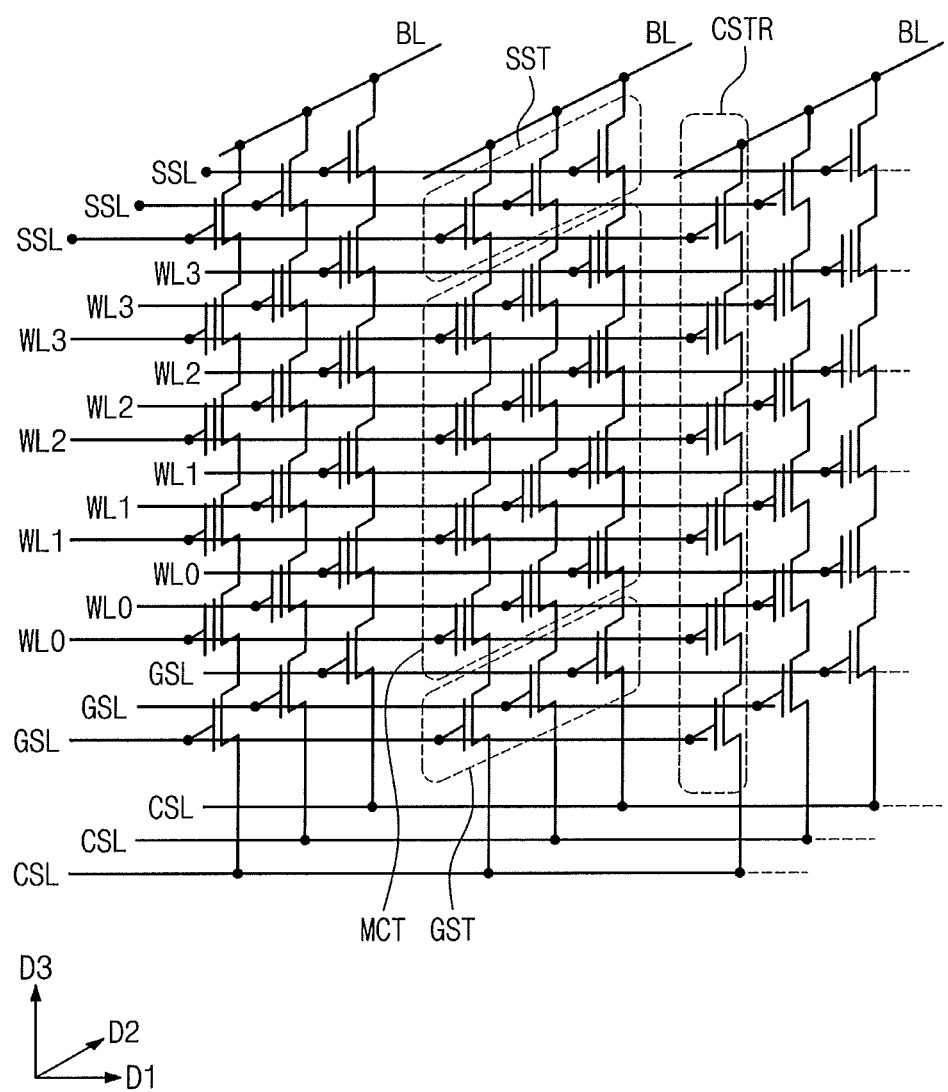
FIG. 2 is a circuit diagram illustrating a cell array of a semiconductor device according to exemplary embodiments of the present inventive concept.

FIG. 2 is a circuit diagram illustrating a cell array of a semiconductor device according to exemplary embodiments of the present inventive concept.

Referring to FIG. 2, a cell array may include a common source line CSL, a plurality of bit lines BL, and a plurality of cell strings CSTR disposed between the common source line CSL and the bit lines BL.

The bit lines BL may be two-dimensionally arranged, and a plurality of the cell strings CSTR may be connected in parallel to each of the bit lines BL. The cell strings CSTR may be connected in common to the common source line CSL. That is, a plurality of the cell strings CSTR may be disposed between a plurality of the bit lines BL and one common source line CSL. For example, the common source line CSL may be provided in plural, which are two-dimensionally arranged. In this configuration, the common source lines CSL may be supplied with the same voltage or electrically controlled independently of each other.

Each of the cell strings CSTR may include a ground select transistor GST coupled to the common source line CSL, a string select transistor SST coupled to the bit line BL, and a plurality of memory cell transistors MCT disposed between the ground and string select transistors GST and SST. The ground select transistor GST, the string select transistor SST, and the memory cell transistors MCT may be connected in series.

The common source line CSL may be connected in common to sources of the ground select transistors GST. A ground select line GSL, a plurality of word lines WL0 to WL3, and a plurality of string select lines SSL disposed between the common source line CSL and the bit lines BL may be used as gate electrodes of the ground select transistor GST, the memory cell transistors MCT, and the string select transistor SST, respectively. Each of the memory cell transistors MCT may include a data storage element.

Figure 3:
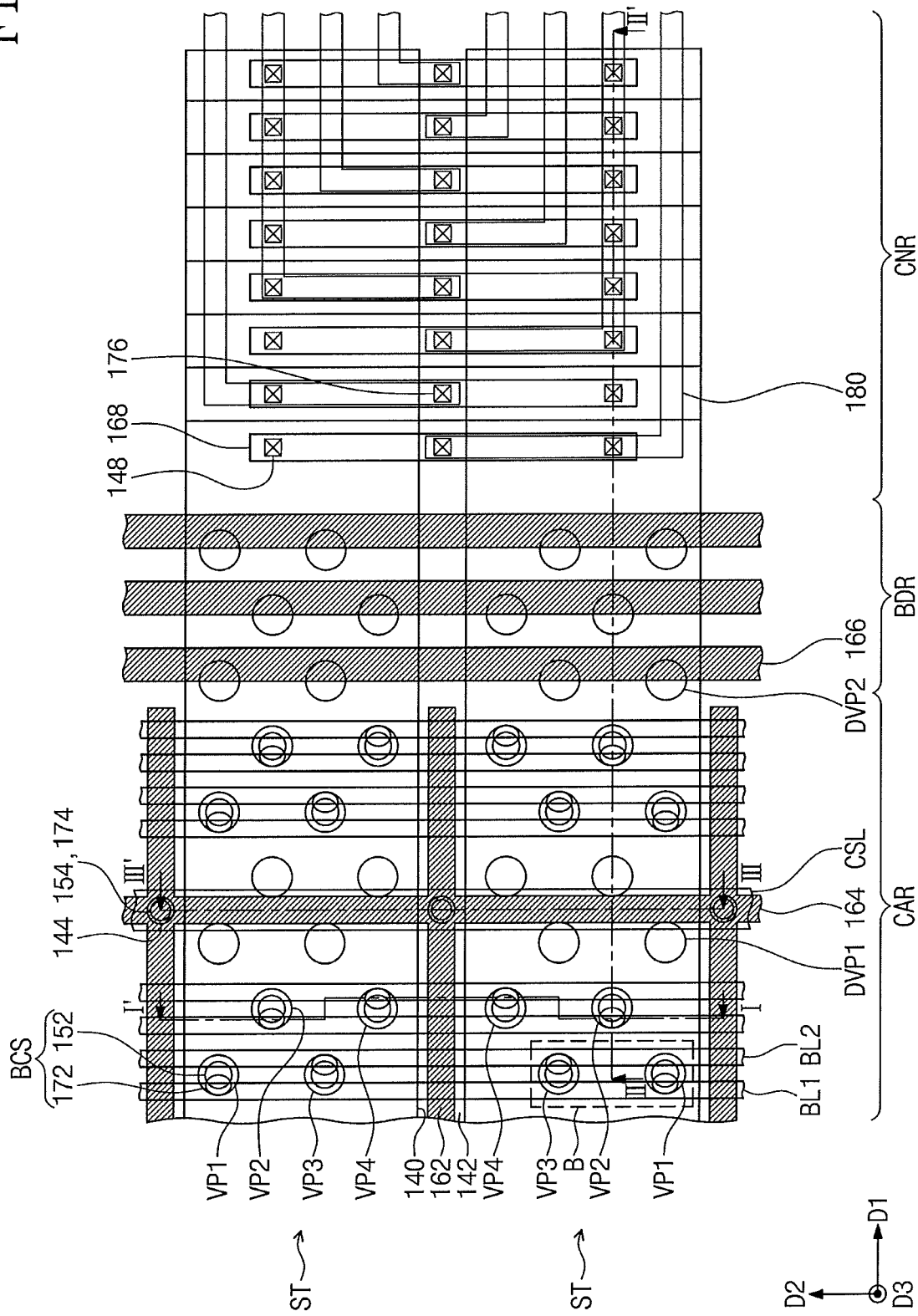
FIG. 3 is a plan view for explaining a semiconductor device according to exemplary embodiments of the present inventive concept.
Figure 4A:
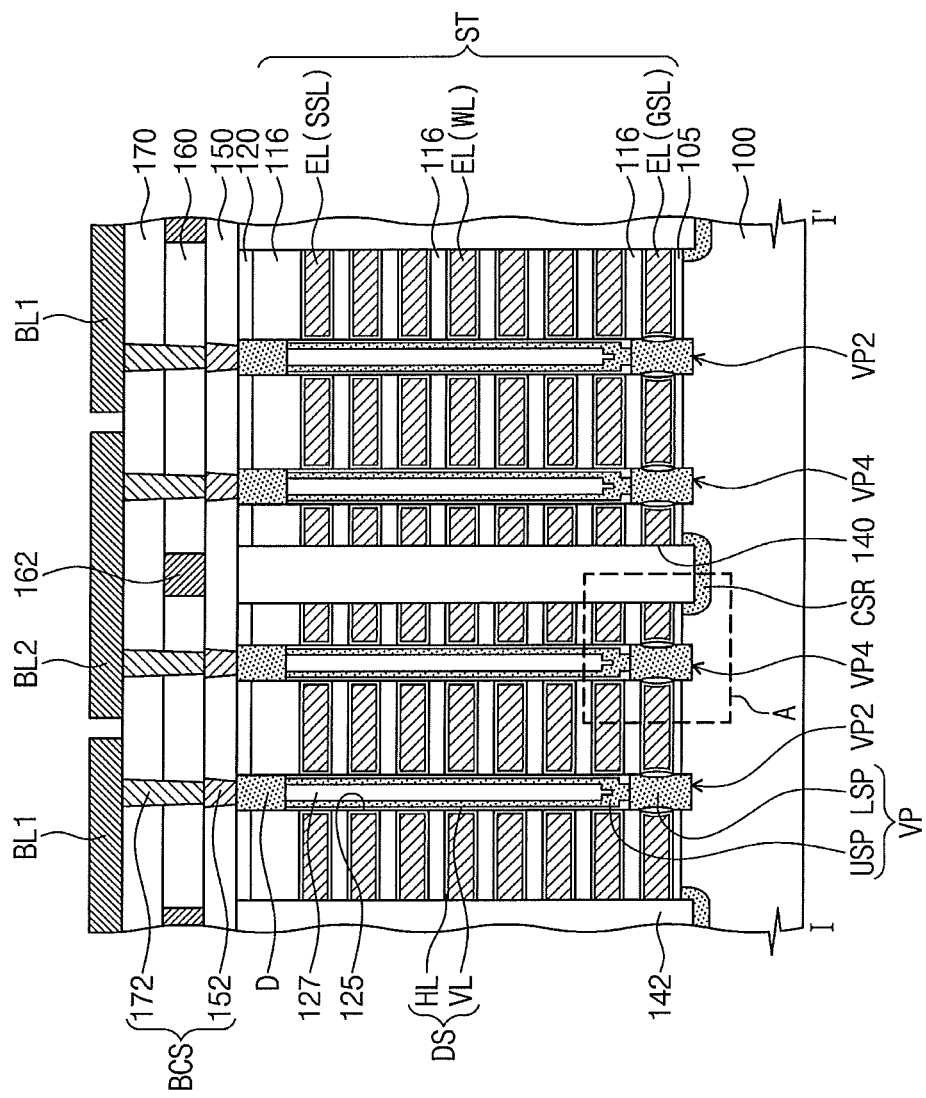
FIGS. 4A, 4B, and 4C are cross-sectional views respectively taken along lines I-I', II-II', and III-III' of FIG. 3.
Figure 4B:
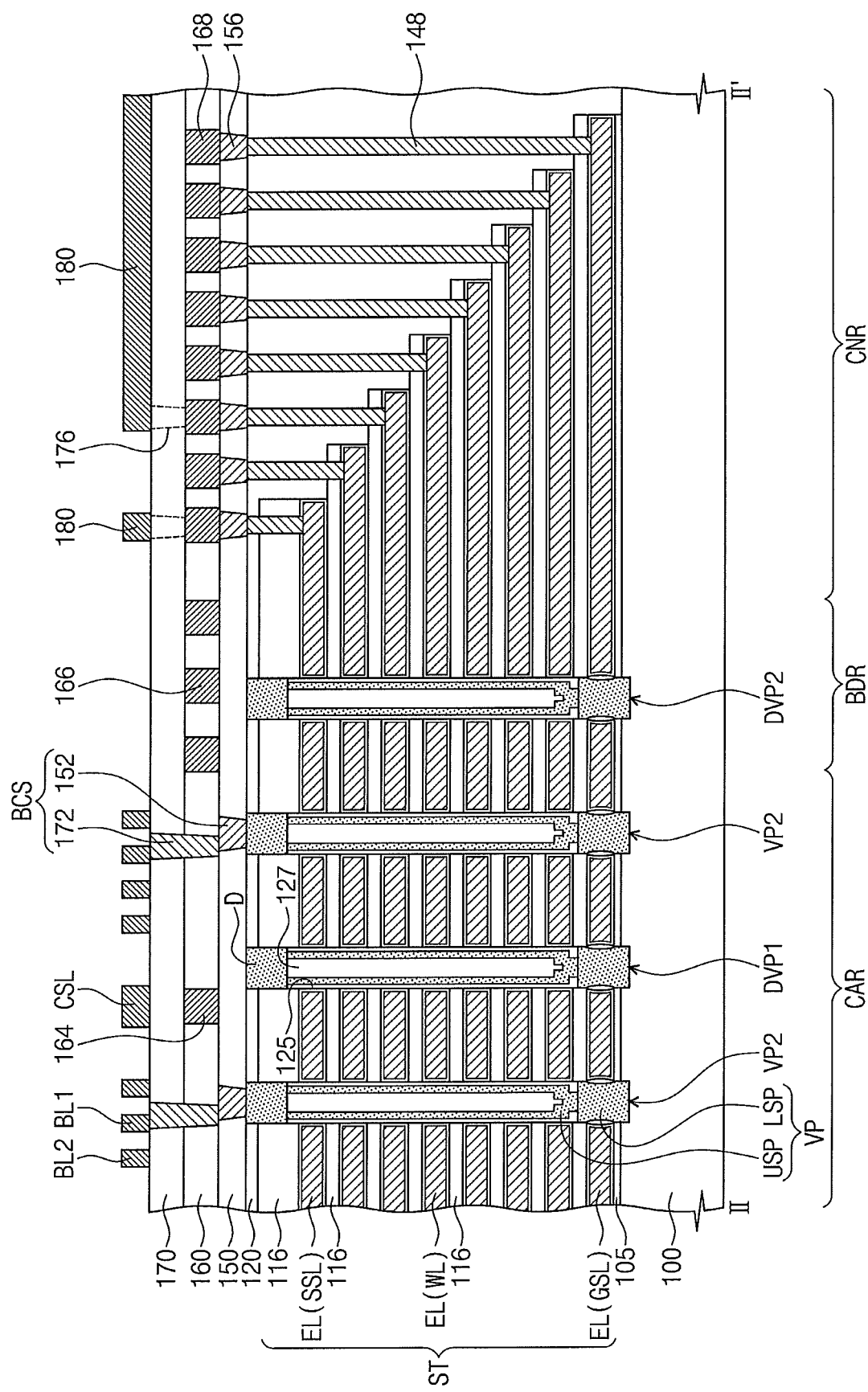
Figure 4C:
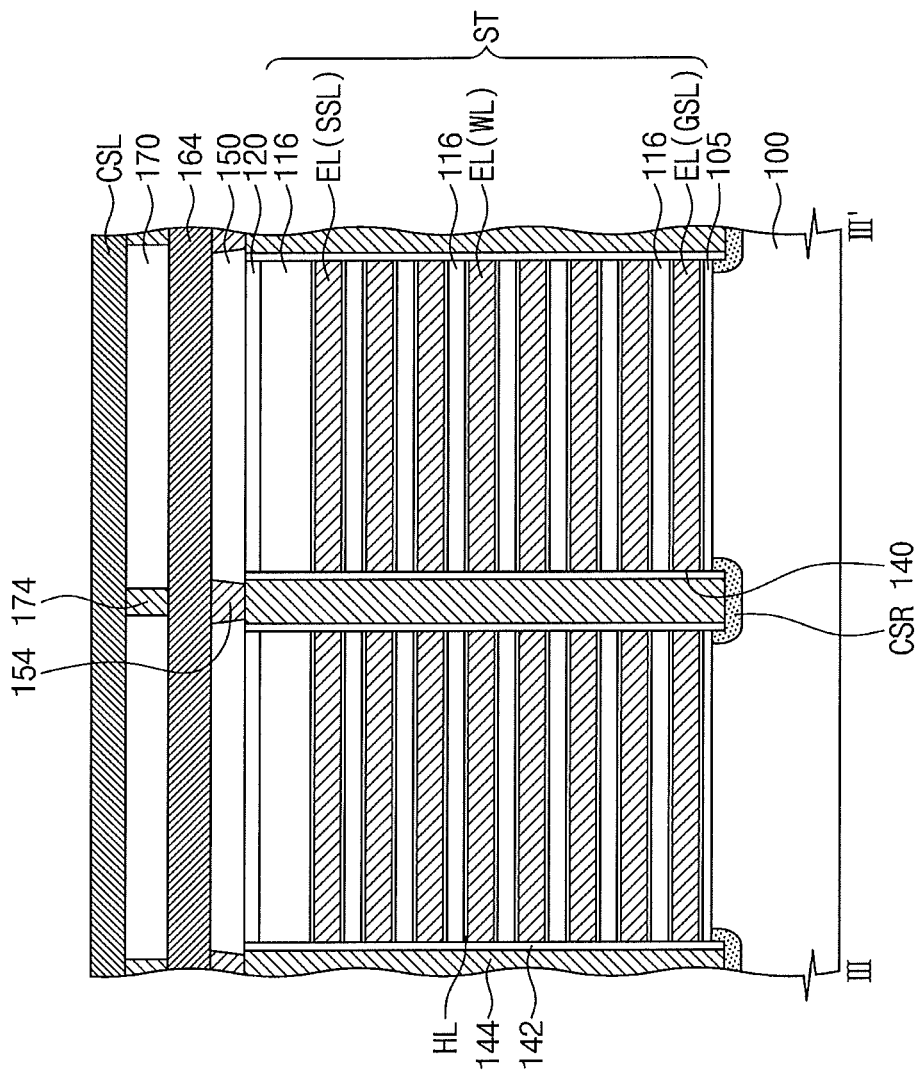
Figure 5A:
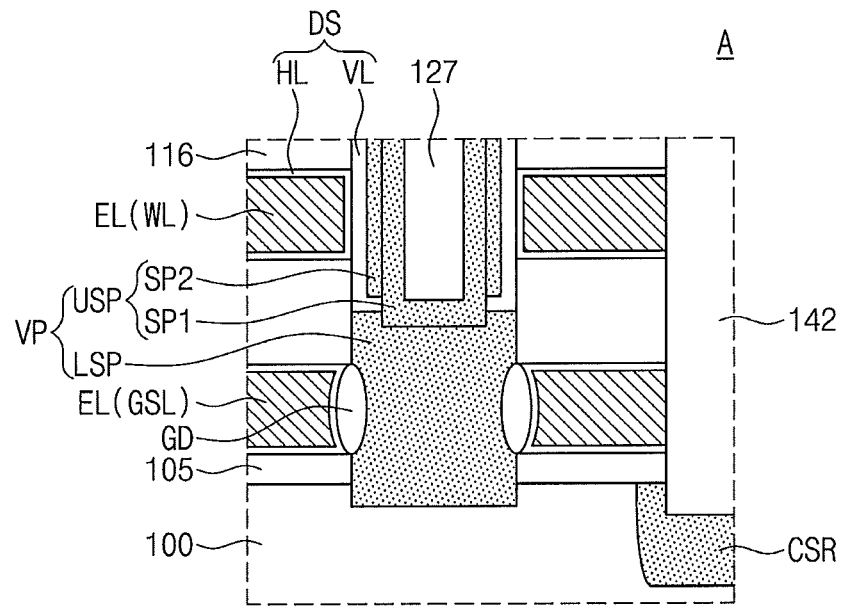
FIGS. 5A and 5B are enlarged views corresponding to section A of FIG. 4A.
Figure 5B:
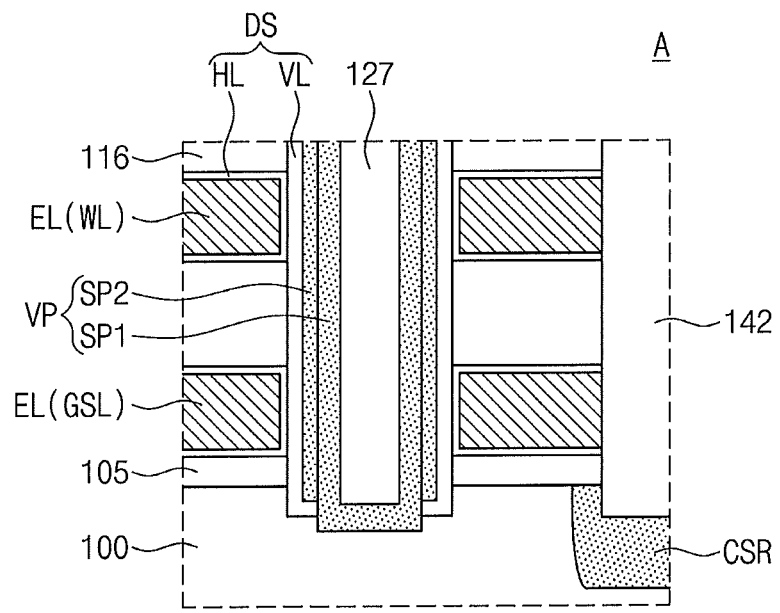

FIG. 3 is a plan view for explaining a semiconductor device according to exemplary embodiments of the present inventive concept. FIGS. 4A, 4B, and 4C are cross-sectional views respectively taken along lines I-I', II-II', and III-III' of FIG. 3. FIGS. 5A and 5B are enlarged views corresponding to section A of FIG. 4A.

Referring to FIGS. 3, 4A to 4C, and 5A, a substrate 100 may be provided to include a cell array region CAR, a connection region CNR, and a boundary region BDR between the cell array region CAR and the connection region CNR. The substrate 100 may be a semiconductor substrate having a first conductivity, for example, p-type conductivity. The semiconductor substrate may include at least one selected from the group consisting of a single crystalline silicon layer, an SOI (Silicon On Insulator) substrate, a silicon layer formed on a silicon-germanium (SiGe) layer, a single crystalline silicon layer formed on an insulation layer, and a polysilicon layer formed on an insulation layer.

A plurality of stack structures ST may be disposed on the substrate 100. As shown in FIG. 3, the stack structures ST may extend in a first direction D1, and may be spaced apart from each other in a second direction D2 crossing (e.g., perpendicular to) the first direction D1. For example, the stack structures ST may extend from the cell array region CAR toward the connection region CNR, and may be spaced apart from each other in the second direction D2 by a first separation region 140 extending in the first direction D1.

Each of the stack structures ST may include insulation patterns 116 and gate electrodes EL that are vertically and alternately stacked on the substrate 100. The gate electrodes EL may include a ground select line GSL, word lines WL, and a string select line SSL that are sequentially stacked on the substrate 100. The ground select line GSL, the word lines WL, and the string select line SSL may correspond respectively to the ground select line GSL, the word lines WL0 to WL3, and the string select line SSL discussed with reference to FIG. 2. The ground select line GSL and the string select line SSL may each be provided in single, and six word lines WL may be stacked between the ground select line GSL and the string select line SSL, but embodiments of the present inventive concept are not limited thereto. The ground select line GSL and the string select line SSL may each be provided in plural, and seven or more word lines WL may be provided. The gate electrodes EL may include doped silicon, metal (e.g., tungsten), metal nitride, metal silicide, or a combination thereof.

The insulation patterns 116 may have thicknesses that are changed based on characteristics of a semiconductor device. For example, the insulation patterns 116 may have substantially the same thickness. Alternatively, at least one (e.g., an uppermost insulation pattern) of the insulation patterns 116 may be formed thicker than other insulation patterns 116 between the word lines WL. The insulation patterns 116 may include, for example, a silicon oxide layer. A buffer insulation layer 105 may be disposed between the substrate 100 and the stack structures ST. The buffer insulation layer 105 may have a thickness less than those of the insulation patterns 116 overlying the buffer insulation layer 105. The buffer insulation layer 105 may be, for example, a silicon oxide layer.

The stack structures ST may each have a stepwise structure on the connection region CNR. In detail, the stack structures ST may each have a height on the connection region CNR, and the height may decrease stepwise as away from the cell array region CAR (i.e., along the first direction D1). In other words, the gate electrodes EL may have their areas that decrease with increasing distance from a top surface of the substrate 100. In this configuration, the gate electrodes EL may have their sidewalls at different horizontal positions on the connection region CNR, and each of the gate electrodes EL except for an uppermost gate electrode (e.g., the string select line SSL) may have an end portion exposed through a neighboring upper gate electrode EL.

A first separating insulation layer 142 may be disposed between the stack structures ST adjacent to each other. That is, the first separating insulation layer 142 may be provided in the first separation region 140. The first separating insulation layer 142 may horizontally separate the gate electrodes EL of the stack structures ST adjacent to each other. A common source region CSR may be provided in the substrate 100 under the first separating insulation layer 142. The common source region CSR may extend along the first direction D1 in the substrate 100. The common source region CSR may have a second conductivity (e.g., n-type conductivity) different from the first conductivity. As shown in FIG. 4C, the common source region CSR may be coupled to a common source plug 144 that penetrates the first separating insulation layer 142. For example, the common source plus 144 may penetrate the first separating insulation layer 142 and may be locally coupled to the common source region CSR. The common source plug 144 may have a pillar shape. A plurality of the common source plugs 144 may be arranged along the second direction D2 to penetrate corresponding first separating insulation layers 142, and electrically connected in common to one common source line CSL extending along the second direction D2. Although not shown in figures, a single first separating insulation layer 142 may be provided therein with a plurality of the common source plugs 144 arranged along the first direction D1.

The stack structures ST may be penetrated with vertical holes 125 through which the substrate 100 is exposed, and vertical pillars VP may be provided in the vertical holes 125. The substrate 100 may be coupled to the vertical pillars VP penetrating the stack structures ST. In addition, the vertical pillars VP may combine with the gate electrodes EL. The vertical pillars VP may each have a major axis extending upward (i.e., extending in a third direction D3) from the substrate 100. A conductive pad D may be positioned at or on an upper end of each of the vertical pillars VP. The conductive pad D may be composed of an impurity doped region or a conductive material.

The vertical pillars VP may include a semiconductor material or a conductive material. In some embodiments, as shown in FIG. 5A, each of the vertical pillars VL may include a lower semiconductor pattern LSP and an upper semiconductor pattern USP. For example, the lower and upper semiconductor patterns LSP and USP may include silicon (Si), germanium (Ge), or a combination thereof, and have different crystal structures from each other. The lower and upper semiconductor patterns LSP and USP may have one or more selected from a single crystalline structure, an amorphous structure, and a polycrystalline structure. The lower and upper semiconductor patterns LSP and USP may be undoped or doped with an impurity whose conductivity is the same as that of the substrate 100.

The substrate 100 may be in direct contact with the lower semiconductor pattern LSP that penetrates the ground select line GSL. The lower semiconductor pattern LSP may have a lower end inserted into the substrate 100. The upper semiconductor pattern USP may include a first semiconductor pattern SP1 and a second semiconductor pattern SP2. The first semiconductor pattern SP1 may be coupled to the lower semiconductor pattern LSP, and may have a macaroni or pipe shape whose bottom end is closed. In an embodiment, the first semiconductor pattern SP1 may have an inside filled with a filling insulation layer 127. The first semiconductor pattern SP1 may be in contact with an inner wall of the second semiconductor pattern SP2 and a top surface of the lower semiconductor pattern LSP. In this configuration, the first semiconductor pattern SP1 may electrically connect the second semiconductor pattern SP2 to the lower semiconductor pattern LSP. The second semiconductor pattern SP2 may have a macaroni or pipe shape whose top and bottom ends are open. The second semiconductor pattern SP2 may be spaced apart from the lower semiconductor pattern LSP without being in contact therewith. A gate dielectric layer GD may be interposed between the lower semiconductor pattern LSP and the ground select line GSL. The gate dielectric layer GD may be, for example, a silicon oxide layer.

In other embodiments, the vertical pillars VP may have no lower semiconductor patterns LSP. For example, as shown in FIG. 5B, the vertical pillar VP may be composed of the first and second semiconductor patterns SP1 and SP2. The substrate 100 may be in direct contact with the first semiconductor pattern SP1 that penetrates the ground select line GSL. In an embodiment, the first semiconductor pattern SP1 may be in contact with an inner wall of the second semiconductor pattern SP2 and a top surface of the substrate 100. In this configuration, the first semiconductor pattern SP1 may electrically connect the second semiconductor pattern SP2 to the substrate 100. The first semiconductor pattern SP1 may have a bottom surface lower than the top surface of the substrate 100.

The vertical pillars VP penetrating one stack structure ST may include first, second, third, and fourth vertical pillars VP1, VP2, VP3, and VP4 that are disposed in a zigzag fashion either along the second direction D2 or along a direction opposite to the second direction D2. For example, the first and third vertical pillars VP1 and VP3 may be adjacent to each other in the second direction D2 and disposed in a diagonal direction with respect to the second and fourth vertical pillars VP2 and VP4. Each of the first to fourth vertical pillars VP1 to VP4 may be provided in plural, which may be disposed along the first direction D1 to constitute a row. In some embodiments, the first to fourth vertical pillars VP1 to VP4 coupled to one string select line SSL (in other words, penetrating one stack structure ST) and other first to fourth vertical pillars VP1 to VP4 coupled to a next neighboring string select line SSL may be arranged to have mirror symmetry about the first separating insulation layer 142. The present embodiments illustrate that each of the stack structures ST is penetrated with the vertical pillars VP1 to VP4 constituting four rows, but the present inventive concept is not limited thereto. The number of rows of the vertical pillars VP penetrating one string select line SSL may be variously changed.

Some of the vertical pillars VP constituting a plurality of rows may be dummy vertical pillars DVP1 and DVP2. For example, the dummy vertical pillars DVP1 and DVP2 may include first dummy vertical pillars DVP1 provided on the cell array region CAR and second dummy vertical pillars DVP2 provided on the boundary region BDR. As viewed in plan, the first dummy vertical pillars DVP1 may be disposed adjacent to one of opposite sides of the common source line CSL and arranged in a zigzag fashion along the second direction D2. The dummy vertical pillars DVP1 and DVP2 may not be provided thereon with bit line lower contacts 152 and/or bit line upper contacts 172 which will be discussed below. Consequently, the dummy vertical pillars DVP1 and DVP2 may not be connected to bit lines BL1 and BL2 which will be discussed below. Although not shown in figures, the stack structures ST may be penetrated with other dummy vertical pillars provided on the connection CNR.

Data storage layers DS may be disposed between the stack structures ST and the vertical pillars VP. The data storage layer DS may include, as shown in FIG. 5A, a vertical insulation layer VL and a horizontal insulation layer HL. The vertical insulation layer VL may penetrate the stack structure ST, and the horizontal insulation layer HL may extend onto top and bottom surfaces of the gate electrodes EL from between the gate electrodes EL and the vertical insulation layers VL. In some embodiments, a semiconductor device of the present inventive concept may be a NAND Flash memory device. For example, the data storage layer DS may include a tunnel insulation layer, a charge storage layer, and a blocking insulation layer. The charge storage layer may be a charge trap layer or an insulation layer including conductive nanoparticles. In more detail, the charge storage layer may include one or more of a silicon nitride layer, a silicon oxynitride layer, a silicon-rich nitride layer, and a nanocrystalline silicon layer. The tunnel insulation layer may include one of materials having a band gap greater than that of the charge storage layer. For example, the tunnel insulation layer may be a silicon oxide layer. The blocking insulation layer may include one or more of a first blocking layer inclusive of a silicon oxide layer and a second blocking layer inclusive of a high-k dielectric layer such as an aluminum oxide layer or a hafnium oxide layer. Data stored in the data storage layer DS may be changed by Fouler-Nordheim tunneling induced by a voltage difference between the gate electrodes EL and the vertical pillars VP including a semiconductor material.

The substrate 100 may be provided on its entire surface with a buried insulation layer 120 covering a plurality of the stack structures ST. The buried insulation layer 120 may have a vertical thickness on the connection region CNR, and the vertical thickness may increase stepwise as away from the cell array region CAR. The buried insulation layer 120 may have a planarized top surface. The vertical pillars VP may have top surfaces at substantially the same height as that of the top surface of the buried insulation layer 120. That is, the top surfaces of the vertical pillars VP may be coplanar with the top surface of the buried insulation layer 120. The buried insulation layer 120 may be sequentially provided thereon with first, second, and third interlayer dielectric layers 150, 160, and 170 covering the stack structures ST. The buried insulation layer 120 and each of the interlayer dielectric layers 150, 160, and 170 may include one or more of a silicon oxide layer, a silicon nitride layer, a silicon oxynitride layer, and a low-k dielectric layer whose dielectric constant is lower than that of a silicon oxide layer.

Bit lines BL1 and BL2 may be disposed on the third interlayer dielectric layer 170 of the cell array region CAR. The bit lines BL1 and BL2 may run across the stack structures ST while extending in the second direction D2. The bit lines BL1 and BL2 may include a first bit line BL1 and a second bit line BL2 that are alternately disposed along the first direction D1. According to embodiments of the present inventive concept, each of the first and second bit lines BL1 and BL2 may be connected in common through corresponding bit line contact structures BCS to at least a pair of the vertical pillars VP spaced apart from each other in the second direction D2. For example, as shown in FIG. 3, the first bit line BL1 may be electrically connected in common to a pair of the first vertical pillars VP1 spaced apart from each other in the second direction D2 across the first separating insulation layer 142. Similarly, the second bit line BL2 may be electrically connected in common to a pair of the third vertical pillars VP3 spaced apart from each other in the second direction D2 across the first separating insulation layer 142. In this sense, a pair of the vertical pillars VP connected in common to one of the bit lines BL1 and BL2 may be spaced apart from each other in the second direction D2 and may be respectively coupled to the string select lines SSL. The bit lines BL1 and BL2 may not be provided on the third interlayer dielectric layer 170 of the boundary region BDR.

Figure 6A:
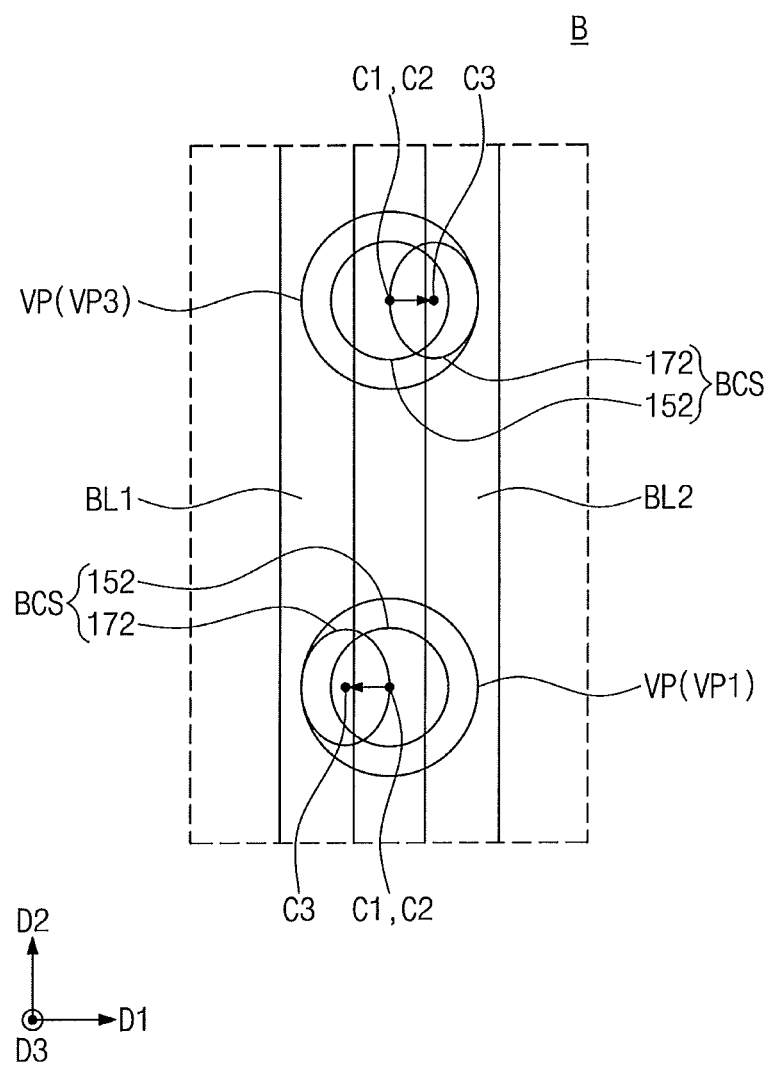
FIGS. 6A, 6C, and 6D are enlarged plan views corresponding to section B of FIG. 3 illustrating an arrangement of vertical pillars, a bit line contact structure, and bit lines according to exemplary embodiments of the present inventive concept.
Figure 6B:
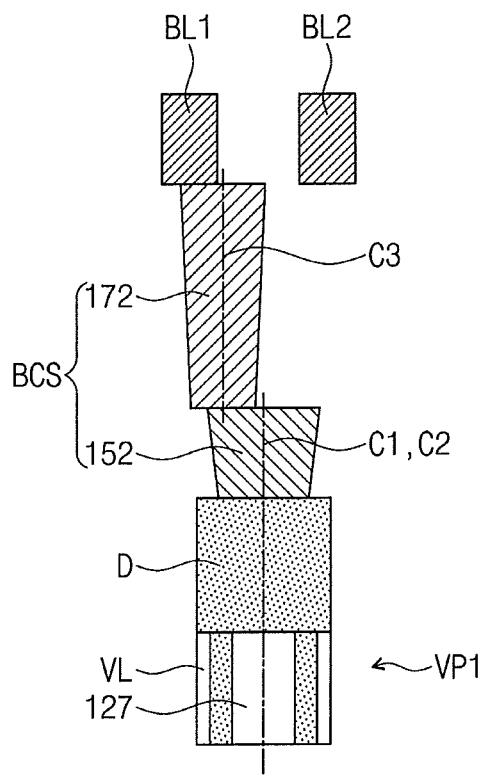
FIG. 6B is a partial cross-sectional view illustrating an arrangement of vertical pillars, a bit line contact structure, and bit lines according to exemplary embodiments of the present inventive concept.
Figure 6C:
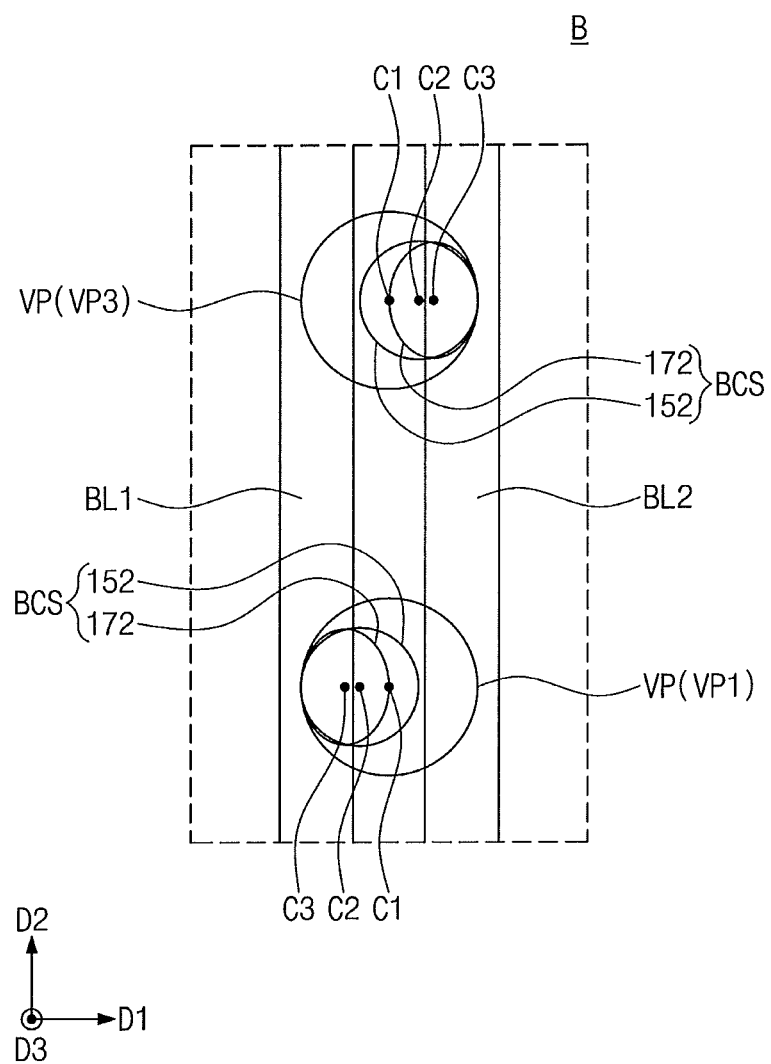
Figure 6D:
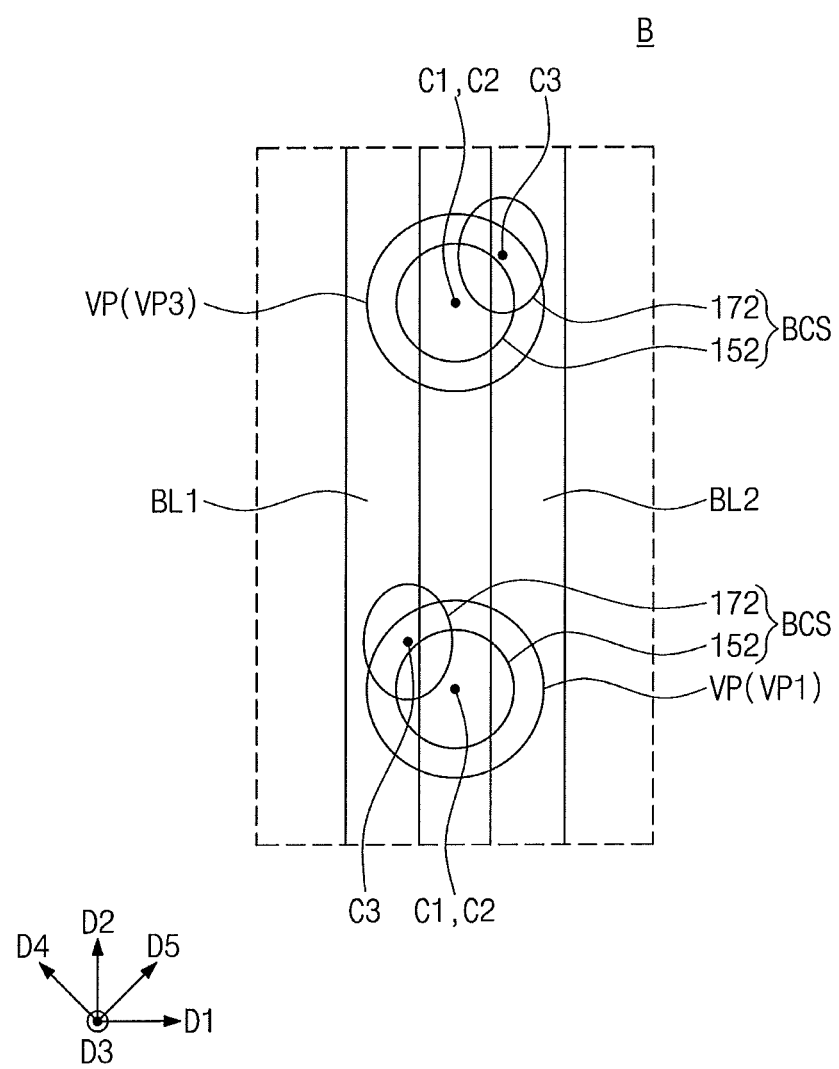

Each of the bit line contact structures BCS may include a bit line lower contact 152 and a bit line upper contact 172. The bit line lower contact 152 may be coupled to the vertical pillar VP while penetrating the first interlayer dielectric layer 150. The bit line upper contact 172 may penetrate the second and third interlayer dielectric layers 160 and 170, and may connect the bit line lower contact 152 to a corresponding one of the bit lines BL1 and BL2. In an embodiment, the bit line upper contact 172 may have a top surface coupled to one of the bit lines BL1 and BL2 and a bottom surface coupled to the bit line lower contact 152. Hereinafter, FIGS. 6A to 6D are referenced to describe in detail an arrangement of the vertical pillars VP, the bit line contact structure BCS, and the bit lines BL1 and BL2. FIGS. 6A, 6C, and 6D are enlarged plan views corresponding to section B of FIG. 3 for explaining an arrangement of the vertical pillars, the bit line contact structure, and the bit lines according to exemplary embodiments of the present inventive concept. FIG. 6B is a partial cross-sectional view for explaining an arrangement of the vertical pillars, the bit line contact structure, and the bit lines according to exemplary embodiments of the present inventive concept.

Referring to FIGS. 6A and 6B, the top surface of the vertical pillar VP may have a center C1 (or a central axis of the vertical pillar VP) offset from a center C3 (or a central axis of the bit line upper contact 172) of the top surface of the bit line upper contact 172. That is, the bit line upper contact 172 may be shifted in a specific direction from the center C1 of the top surface of the vertical pillar VP under the bit line upper contact 172. For example, the top surface of each of the bit line upper contacts 172 may have the center C3 shifted in the first direction D1 or in a direction opposite to the first direction D1 from the center C1 of the top surface of the vertical pillar VP.

In detail, as shown in FIG. 6A, the first vertical pillar VP1 may be provided thereon with the bit line upper contact 172, which is shifted in a direction opposite to the first direction D1, that overlaps the first bit line BL1 and is spaced apart from the second bit line BL2. The third vertical pillar VP3 may be provided thereon with the bit line upper contact 172, which is shifted in the first direction D1, that overlaps the second bit line BL2 and is spaced apart from the first bit line BL1. As such, the bit lines BL1 and BL2 may be respectively connected to a pair of the vertical pillars VP1 and VP3 that are spaced apart from each other in the second direction D2 and are connected to one string select line SSL. In some embodiments, a center C2 of a top surface of the bit line lower contact 152 and the center C1 of the top surface of the vertical pillar VP may be aligned in the third direction D3 perpendicular to the top surface of the substrate 100. Embodiments of the present inventive concept, however, are not limited thereto.

In other embodiments, the center C2 of the top surface of the bit line lower contact 152 may be offset from the center C1 of the top surface of the vertical pillar VP. For example, as shown in FIG. 6C, the center C2 of the top surface of the bit line lower contact 152 may be shifted in a direction opposite to the first direction D1 from the center C1 of the top surface of the first vertical pillar VP1 under the bit line lower contact 152. Alternatively, the center C2 of the top surface of the bit line lower contact 152 may be shifted in the first direction D1 from the center C1 of the top surface of the third vertical pillar VP3 under the bit line lower contact 152.

In still other embodiments, the center C3 of the top surface of the bit line upper contact 172 may be shifted in a diagonal direction from the center C1 of the top surface of the vertical pillar VP. In this description, the diagonal direction may mean a direction crossing all of the first and second directions D1 and D2. For example, as shown in FIG. 6D, the center C2 of the top surface of the bit line lower contact 152 may be shifted in a first diagonal direction D4 from the center C1 of the top surface of the first vertical pillar VP1 under the bit line lower contact 152. Alternatively, the center C2 of the top surface of the bit line lower contact 152 may be shifted in a second diagonal direction D5 from the center C1 of the top surface of the third vertical pillar VP3 under the bit line lower contact 152.

As shown in FIGS. 6A, 6C, and 6D, the bit line upper contact 172 may have a planar elliptical shape having major and minor axes. For example, the bit line upper contact 172 may have a major axis in parallel to the second direction D2 and a minor axis in parallel to the first direction D1. As shown in FIG. 6B, the bit line upper contact 172 may have a vertical length greater than that of the bit line lower contact 152.

Referring to FIGS. 3, 4A to 4C, and 5A, dummy lines 162, 164, and 166 may be disposed in the second interlayer dielectric layer 160. The dummy lines 162, 164, and 166 may include cell dummy lines 162 and 164 disposed in the second interlayer dielectric layer 160 on the cell array region CAR and peripheral dummy lines 166 disposed in the second interlayer dielectric layer 160 on the boundary region BDR. The cell and peripheral dummy lines 162, 164, and 166 may be coplanar with a top surface of the second interlayer dielectric layer 160. In other words, the cell and peripheral dummy lines 162, 164, and 166 may have top surfaces higher than those of the bit line lower contacts 152 and lower than those of the bit line upper contacts 172.

The cell dummy lines 162 and 164 may be provided on a region where the bit line lower contacts 152 are not formed. For example, the cell dummy lines 162 and 164 may include a first cell dummy line 162 disposed on the first separating insulation layer 142 between the stack structures ST adjacent to each other and a second cell dummy line 164 disposed under the common source line CSL. That is, as viewed in plan, the first cell dummy line 162 may overlap the first separating insulation layer 142, and the second cell dummy line 164 may overlap the common source line CSL. As discussed above, vertical pillars adjacent to the common source line CSL may correspond to the first dummy vertical pillars DVP1, and the bit line lower contacts 152 may not be disposed on the first dummy vertical pillars DVP1. The common source line CSL may be positioned at the same level as that of the bit lines BL1 and BL2. For example, the common source line CSL may be disposed on the third interlayer dielectric layer 170 of the cell array region CAR and interposed between the bit lines BL1 and BL2.

According to embodiments of the present inventive concept, a plurality of the first cell dummy lines 162 may extend in the first direction D1 while each being disposed on a corresponding one of the first separating insulation layers 142 spaced apart from each other in the second direction D2. The second cell dummy line 164 may extend in the second direction D2 along the common source line CSL, and may be connected to a plurality of the first cell dummy lines 162. The second cell dummy line 164 may partially overlap each of the first cell dummy lines 162. Although not shown in figures, the second cell dummy line 164 may be provided in plural, which are disposed along the first direction D1. In this case, the first and second cell dummy lines 162 and 164 may constitute a lattice or grid structure.

First lower contacts 154 may be disposed between the second cell dummy line 164 and the common source plugs 144. For example, the first interlayer dielectric layer 150 on the cell array region CAR may be provided therein with the first lower contacts 154, each of which may connect a corresponding one of the common source plugs 144 to the second cell dummy line 164. One second cell dummy line 164 may be connected in common to a plurality of the first lower contacts 154 disposed along the second direction D2.

A first upper contact 174 may be disposed between the second cell dummy line 164 and the common source line CSL. For example, the first upper contact 174 may be disposed on the third interlayer dielectric layer 170 on the cell array region CAR and may connect the second cell dummy line 164 to the common source line CSL. The first upper contact 174 may be provided in plural, and the plurality of the first upper contacts 174 may be arranged along the second direction D2. As viewed in plan, the common source plugs 144, the first lower contacts 154, and the first upper contacts 174 may be positioned at intersections between the first and second cell dummy lines 162 and 164. Consequently, the common source line CSL may be electrically connected to a plurality of the common source plugs 144 through the first upper contacts 174, the second cell dummy line 164, and the first lower contacts 154.

The peripheral dummy lines 166 may be disposed in the second interlayer dielectric layer 160 on the boundary region BDR while being spaced apart from the cell dummy lines 162 and 164. The peripheral dummy lines 166 may be disposed along the first direction D1 and may have a linear shape extending along the second direction D2. In some embodiments, the boundary region BDR may be provided thereon with three peripheral dummy lines 166, but the present inventive concept is not limited thereto.

The connection region CNR may be provided thereon with a routing structure that connects the vertically stacked gate electrodes EL to peripheral logic circuits (e.g., a decoder). In detail, the connection region CNR may be provided thereon with contact plugs 148 that penetrate the buried insulation layer 120 and are coupled to end portions of the gate electrodes EL. The contact plugs 148 may have top surfaces coplanar with that of the buried insulation layer 120, and have vertical lengths that increase as away from the cell array region CAR. Second lower contacts 156 may each be disposed on a corresponding one of the contact plugs 148. The second lower contacts 156 may penetrate the first interlayer dielectric layer 150 and may be coupled to the contact plugs 148. The contact plugs 148 may include one or more of metal (e.g., tungsten) and conductive metal nitride (e.g., titanium nitride, tantalum nitride, or tungsten nitride).

The second interlayer dielectric layer 160 on the connection region CNR may be provided thereon with lower lines 168 disposed along the first direction D1. Each of the lower lines 168 may be coupled in common to a pair of the second lower contacts 156 spaced apart from each other in the second direction D2. Accordingly, each of the lower lines 168 may be connected in common to a pair of the contact plugs 148 spaced apart from each other in the second direction D2. The lower lines 168 may each have a bar shape having a major axis in the second direction D2, but the present inventive concept is not limited thereto. The lower lines 168 may have top surfaces coplanar with that of the second interlayer dielectric layer 160.

Upper lines 180 may be disposed on the lower lines 168. The upper line 180 may be positioned at the same level as that of the bit lines BL1 and BL2. For example, the upper lines 180 may be disposed on the third interlayer dielectric layer 170 of the connection region CNR. The upper lines 180 may be connected through second upper contacts 176 to the lower lines 168. The second upper contacts 176 may be disposed in the third interlayer dielectric layer 170 of the connection region CNR. As viewed in plan, the second upper contacts 176 may overlap the first separating insulation layer 142 and may be disposed spaced apart from each other along the first direction D1. In some embodiments, each of the upper lines 180 may include a first segment extending in the first direction D1 and a second segment extending either in the second direction D2 or in a direction opposite to the second direction D2 from an end portion of the first segment. For example, each of the upper lines 180 may have an "L" shape. Embodiments of the present inventive concept, however, are not limited thereto. The second segments of the upper lines 180 may be coupled to the second upper contacts 176. The second segments of the upper lines 180 may have lengths that increase with approaching the cell array region CAR.

The contacts 152, 154, 156, 172, 174, and 176, the dummy lines 162, 164, and 166, the bit lines BL1 and BL2, the common source line CSL, the lines 168 and 180 may each include one or more of metal (e.g., tungsten or copper) and conductive metal nitride (e.g., titanium nitride, tantalum nitride, or tungsten nitride). In some embodiments, a first metal (e.g., tungsten) may be included in the contacts 152, 154, 156, 172, 174, and 176, the dummy lines 162, 164, and 166, and the lower lines 168, and a second metal (e.g., copper) may be included in the bit lines BL1 and BL2, the common source line CSL, and the upper lines 180.

According to embodiments of the present inventive concept, the vertical pillars VP may be directly connected through the bit line contact structures BCS to the bit lines BL1 and BL2. One of the bit lines BL1 and BL2 may be connected in common through corresponding bit line contact structures BCS to a pair of the vertical pillars VP, which are spaced apart from each other in the second direction D2 and each of which is coupled to its corresponding one of the string select lines SSL. That is, embodiments of the present inventive concept may have no subsidiary lines required to connect together pairs of the bit line lower contacts 152 adjacent to each other in the second direction D2. In general, the subsidiary lines may be formed in the second interlayer dielectric layer 160 on the cell array region CAR, and simultaneously formed with the lower lines 168 on the connection region CNR. When the lower lines 168 are formed without the subsidiary lines, there may occur a failure (e.g., a dishing resulting from CMP) due to a difference in pattern density between the cell array region CAR and the connection region CNR. In contrast, according to embodiments of the present inventive concept, the dummy lines 162, 164, and 166 may be formed in the second interlayer dielectric layer 160 on the cell array and boundary regions CAR and BDR, such that it may be possible to minimize or reduce occurrence of failure caused by the difference in pattern density mentioned above.

Figure 7:
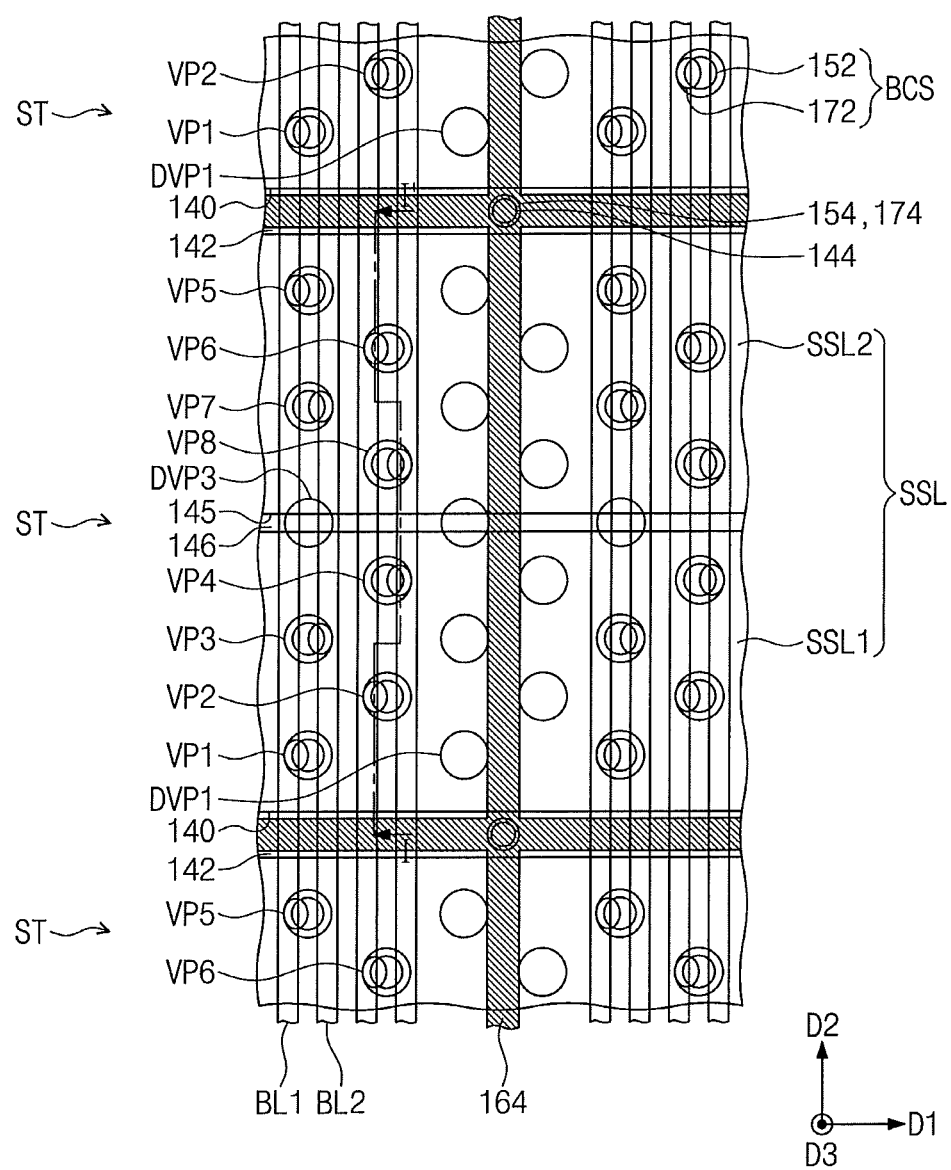
FIG. 7 is a plan view corresponding to a cell array region of FIG. 3 illustrating a semiconductor device according to exemplary embodiments of the present inventive concept.
Figure 8:
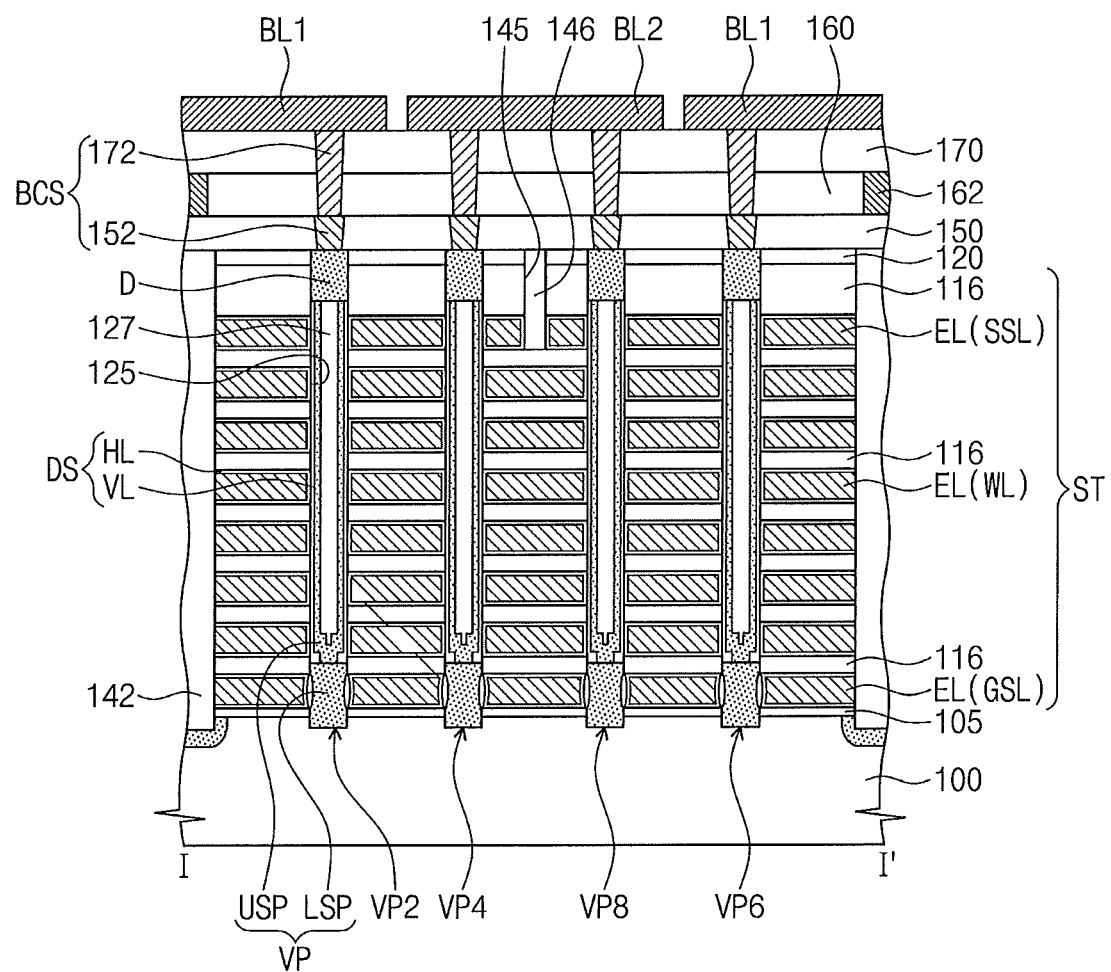
FIG. 8 is a cross-sectional view taken along line I-I' of FIG. 7 according to an exemplary embodiment.

FIG. 7 is a plan view corresponding to the cell array region of FIG. 3 illustrating a semiconductor device according to exemplary embodiments of the present inventive concept. FIG. 8 is a cross-sectional view taken along line I-I' of FIG. 7. For brevity of the description, a detailed explanation will be omitted on the same technical features as those of the semiconductor device discussed above with reference to FIGS. 3, 4A to 4C, and 5A.

Referring to FIGS. 7 and 8, the string select line SSL in each of the stack structures ST may be divided into two string select lines. For example, each of the stack structures ST may include a first string select line SSL1 and a second string select line SSL2 spaced apart from each other in the second direction D2 across a second separating insulation layer 146. The second separating insulation layer 146 may be provided in a second separation region 145. The second separation region 145 may divide only the string select line SSL but not the gate electrodes EL under the string select line SSL. Referring to FIG. 8, the second separating insulation layer 146 may have a bottom surface higher than a top surface of an uppermost word line WL and equal to or lower than a bottom surface of the string select line SSL.

Separating insulation layers according to exemplary embodiments of the present inventive concept may include the first separating insulation layer 142 and the second separating insulation layer 146 spaced apart from each other in the second direction D2, and the first and second separating insulation layers 142 and 146 may define string select lines. At least one of the separating insulation layers spaced apart from each other in the second direction D2 may be a separating insulation layer by which the word lines WL are separated in the second direction D2. In some embodiments, the first separating insulation layer 142 may be a separating insulation layer by which the word lines WL are separated in the second direction D2, and the second separating insulation layer 146 may be a separating insulation by which the string select line SSL is separated. The second separating insulation layer 146 may have a width less than that of the first separating insulation layer 142. The first and second separating insulation layers 142 and 146 may be alternately disposed along the second direction D2.

The vertical pillars VP penetrating one stack structure ST may include first to eighth vertical pillars VP1 to VP8 disposed in a zigzag fashion along the second direction D2. The first to fourth vertical pillars VP1 to VP4 may be coupled to the first string select line SSL1, and the fifth to eighth vertical pillars VP5 to VP8 may be coupled to the second string select line SSL2. For example, the first and third vertical pillars VP1 and VP3 may be adjacent to each other in the second direction D2, and disposed in a diagonal direction with respect to the second and fourth vertical pillars VP2 and VP4. Likewise, the fifth and seventh vertical pillars VP5 and VP7 may be adjacent to each other in the second direction D2, and disposed in a diagonal direction with respect to the sixth and eighth vertical pillars VP6 and VP8. Each of the first to eighth vertical pillars VP1 to VP8 may be provided in plural, which may constitute a row along the first direction D1. In plan view, the first to fourth vertical pillars VP1 to VP4 penetrating the first string select line SSL1 and the firth to eighth vertical pillars VP5 to VP8 penetrating the second string select line SSL2 may be arranged to have mirror symmetry about the second separating insulation layer 146. For example, the fourth and eighth vertical pillars VP4 and VP8 may be adjacent to each other in the second direction D2 across the second separating insulation layer 146.

According to embodiments of the present inventive concepts, third dummy vertical pillars DVP3 may further be provided on the cell array region CAR. The third dummy vertical pillars DVP3 may penetrate the second separating insulation layer 146 and may be disposed to constitute a row along the first direction D1. Likewise the first and second dummy vertical pillars DVP1 and DVP2, the third dummy vertical pillars DVP3 may have the same structures as those of the vertical pillars VP and may not have thereon the bit line lower contacts 152. In other words, when nine rows of the vertical pillars are provided in the stack structure ST that includes the string select lines SSL1 and SSL2 divided by the second separating insulation layers 146, the third dummy vertical pillars DVP3 may be vertical pillars on a fifth row.

The embodiments of FIGS. 5B and 6A to 6D may also be applicable to the embodiments of FIGS. 7 and 8.

Figure 9:
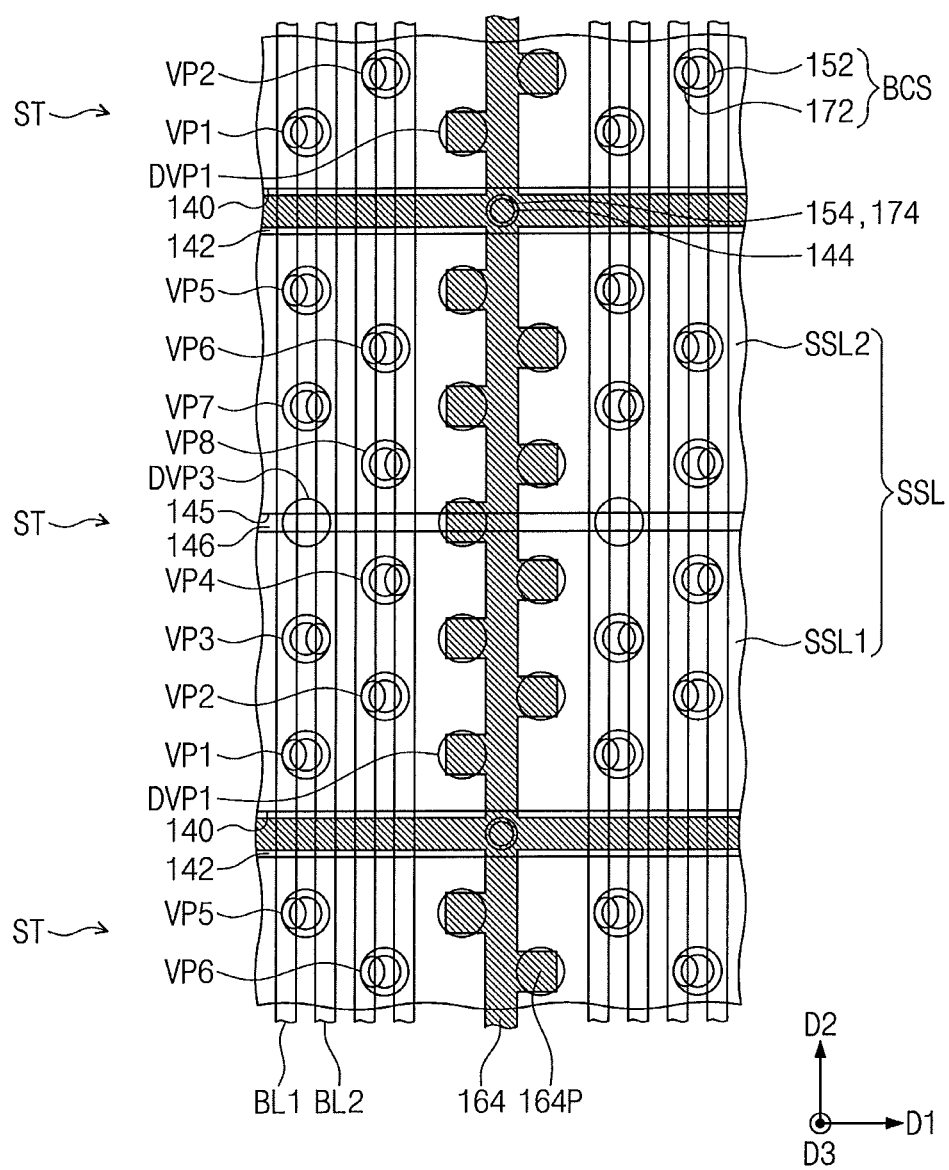
FIG. 9 is a plan view illustrating a semiconductor device according to exemplary embodiments of the present inventive concept.

FIG. 9 is a plan view corresponding to FIG. 7 illustrating a semiconductor device according to exemplary embodiments of the present inventive concept.

Referring to FIG. 9, the second cell dummy line 164 may have protrusions 164P extending either in the first direction D1 or in a direction opposite to the first direction D1 from opposite sidewalls of the second cell dummy line 164. The most adjacent ones of the protrusions 164P may protrude in opposite directions. The protrusions 164P may be disposed in a zigzag fashion along the second direction D2. As viewed in plan, each of the protrusions 164P may overlap the first or third dummy vertical pillar DVP1 or DVP3 disposed under the each of the protrusions 164P. The feature of the second cell dummy line 164 discussed in the current embodiment may also be applicable other embodiments of FIGS. 3, 4A to 4C, and 5A.

FIGS. 10A to 15A are cross-sectional views corresponding to line I-I' of FIG. 3 for explaining a method of fabricating a semiconductor device according to exemplary embodiments of the present inventive concept. FIGS. 10B to 15B are cross-sectional views corresponding to line II-II' of FIG. 3.

Figure 10A:
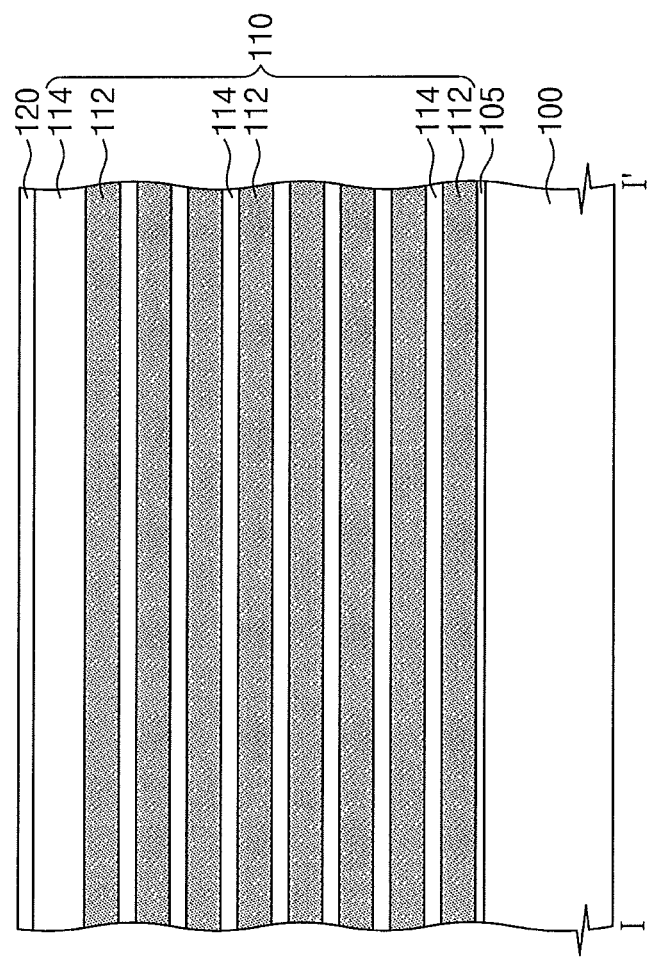
Figure 10B:
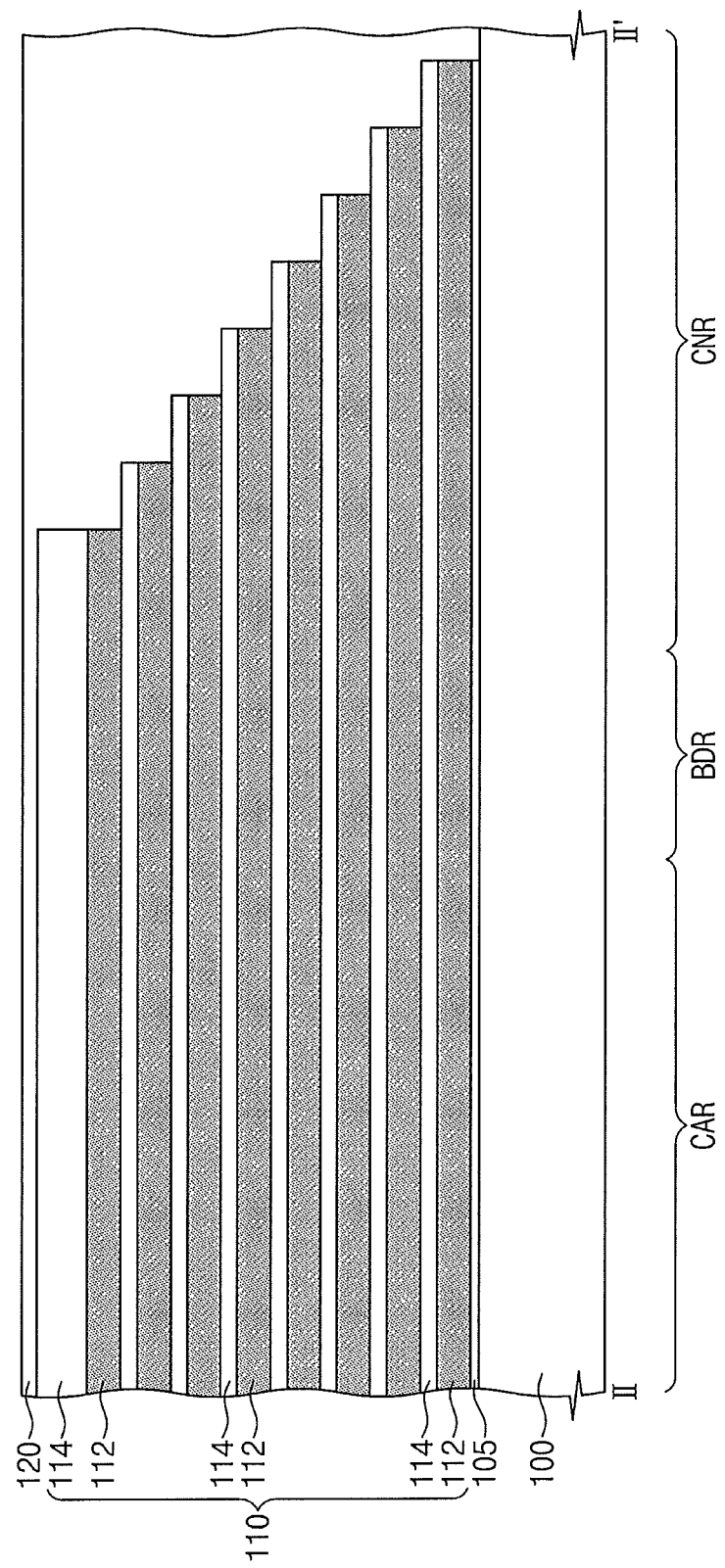

Referring to FIGS. 3, 10A, and 10B, a substrate 100 may be provided to include a cell array region CAR, a connection region CNR, and a boundary region BDR between the cell array region CAR and the connection region CNR. The substrate 100 may be a semiconductor substrate having a first conductivity, for example, p-type conductivity.

A thin-layer structure 110 may be formed on an entire surface of the substrate 100. The thin-layer structure 110 may include sacrificial layers 112 and insulation layers 114 alternately and repeatedly stacked on the substrate 100. The sacrificial layers 112 may be formed of a material that can be etched with an etch selectivity to the insulation layers 114. For example, the sacrificial layers 112 may be one or more of a silicon layer, a silicon carbide layer, a silicon oxynitride layer, and a silicon nitride layer. The insulation layers 114 may be one or more of a silicon layer, a silicon oxide layer, a silicon carbide layer, a silicon oxynitride layer, and a silicon nitride layer, and may have a material different from that of the sacrificial layers 112. In some embodiments, the sacrificial layers 112 may be formed of a silicon nitride layer, and the insulation layers 114 may be formed of a silicon oxide layer. In other embodiments, the sacrificial layers 112 may be formed of a silicon layer, and the insulation layers 114 may be formed of a silicon oxide layer. The sacrificial layers 112 and the insulation layers 114 may be formed by, for example, chemical vapor deposition. The insulation layers 114 may have the same thickness, or alternatively, one or more of the insulation layers 114 may have a different thickness from those of other insulation layers 114. For example, an uppermost insulation layer may have a thickness greater than those of other insulation layers.

The thin-layer structure 110 may be formed to have a stepwise structure on the connection region CNR. The sacrificial layers 112 and the insulation layers 114 of the thin-layer structure 110 may have end portions disposed on the connection region CNR, and sidewalls of the sacrificial layers 112 may be disposed at different horizontal positions on the connection region CNR. The sidewalls of vertically adjacent sacrificial layers 112 may be spaced apart from each other at substantially the same horizontal distance.

The formation of the thin-layer structure 110 may include forming a preliminary thin-layer structure including the sacrificial layers 112 and the insulation layers 114 alternately stacked on the entire surface of the substrate 100 and then patterning the preliminary thin-layer structure. The patterning of the preliminary thin-layer structure may include alternately and repeatedly performing a process in which a mask pattern is reduced in its horizontal area and a process in which the preliminary thin-layer structure is anisotropically etched. The processes mentioned above may be alternately and repeatedly performed such that end portions of the insulation layers 114 may be sequentially exposed on the connection region CNR in an ascending direction toward the cell array region CAR. In other words, the insulation layers 114 may each have a top surface partially exposed on the connection region CNR.

Before the formation of the thin-layer structure 110, a buffer insulation layer 105 may be formed on the substrate 100. For example, the buffer insulation layer 105 may be a silicon oxide layer formed by thermal oxidation. Alternatively, the buffer insulation layer 105 may be a silicon oxide layer formed by a deposition technique. The buffer insulation layer 105 may have a thickness less than those of its overlying sacrificial layers 112 and insulation layers 114.

A buried insulation layer 120 may be formed on the substrate 100 to thereby cover the thin-layer structure 110. The buried insulation layer 120 may be obtained by using a deposition technique to form an insulation layer covering the thin-layer structure 110 and performing a planarization process on the insulation layer. The buried insulation layer 120 may thus have a planarized top surface. The buried insulation layer 120 may include one or more of a silicon oxide layer, a silicon nitride layer, a silicon oxynitride layer, and a low-k dielectric layer whose dielectric constant is lower than that of a silicon oxide layer.

Figure 11A:
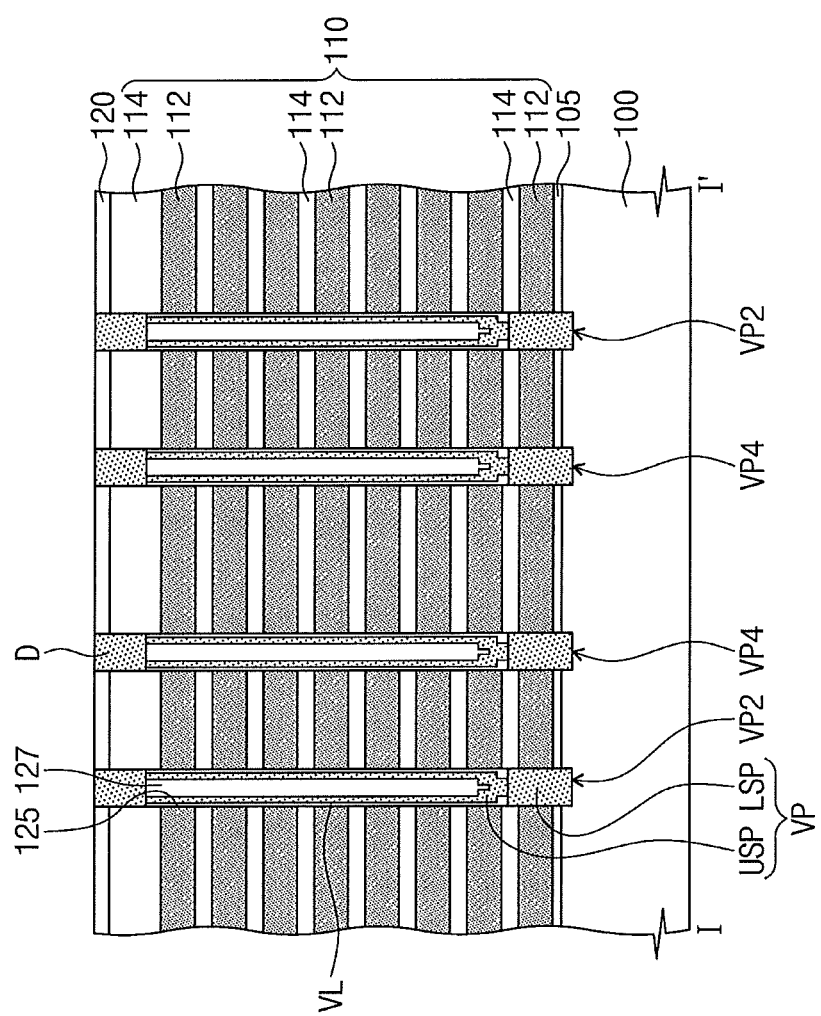
Figure 11B:
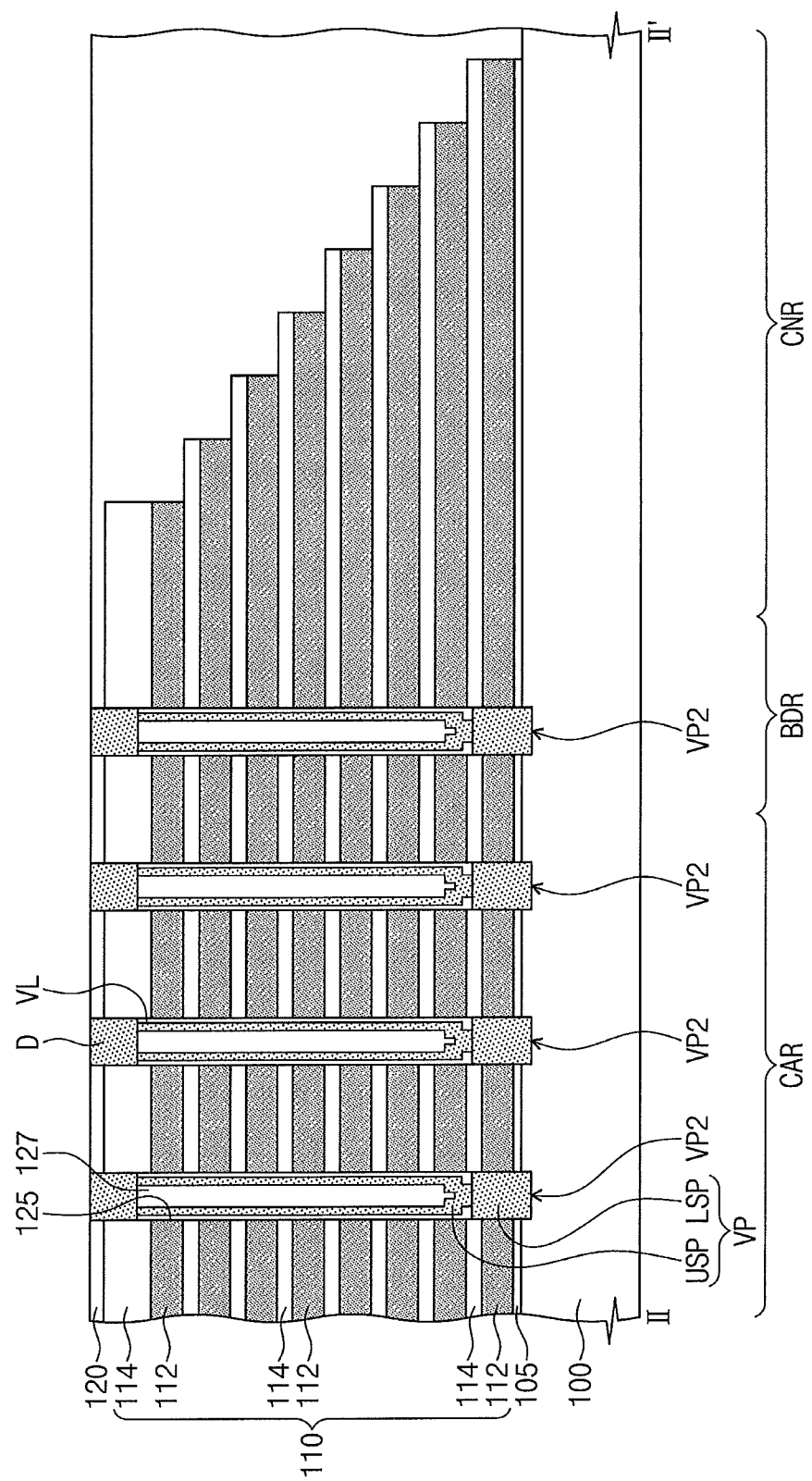

Referring to FIGS. 3, 11A, and 11B, vertical holes 125 may be formed to penetrate the thin-layer structure 110 to thereby expose the substrate 100. In some embodiments, the vertical holes 125 may be obtained by forming a mask pattern on the thin-layer structure 110 and performing an anisotropic etching process that uses the mask pattern as an etch mask. The anisotropic etching process may over-etch a top surface of the substrate 100, and thus the substrate 100 under the vertical holes 125 may be recessed to a predetermined depth.

Lower semiconductor patterns LSP may be formed by performing a selective epitaxial growth (SEG) process that uses the substrate 100 exposed through the vertical holes 125 as a seed. The lower semiconductor patterns LSP may be composed of a material having the same conductivity as that of the substrate 100, and may be formed to have pillar shapes that fill lower portions of the vertical holes 125.

A vertical insulation layer VL and an upper semiconductor pattern USP may be sequentially formed on a sidewall of each of the vertical holes 125 in which the lower semiconductor patterns LSP are formed. The vertical insulation layer VL may include a blocking insulation layer, a tunnel insulation layer, and a charge storage layer sequentially stacked on the sidewall of each of the vertical holes 125. The upper semiconductor pattern USP may be formed to have a hollow pipe shape or a macaroni shape. The upper semiconductor pattern USP may have a closed bottom end. The upper semiconductor pattern USP may have an inside filled with a filling insulation layer 127. The upper semiconductor pattern USP may have a bottom surface lower than a top surface of the lower semiconductor pattern LSP. That is, the upper semiconductor pattern USP may have a structure inserted into the lower semiconductor pattern LSP. The upper semiconductor pattern USP may be composed of a semiconductor material. The upper semiconductor pattern USP may include the first and second semiconductor patterns SP1 and SP2 discussed with reference to FIG. 5A. The lower and upper semiconductor patterns LSP and USP may be defined to refer to vertical pillars VP. For example, the vertical pillars VP may include first to fourth vertical pillars VP1 to VP4 disposed in a zigzag fashion either along a second direction D2 or along a direction opposite to the second direction D2, as shown in FIG. 3. The first to fourth vertical pillars VP1 to VP4 may be disposed along the first direction D1 to respectively constitute first to fourth rows.

Conductive pads D may be formed at upper ends of the vertical pillars VP. The conductive pads D may be formed by recessing upper portions of the vertical pillars VP to form recessed regions at their upper portions and then filling the recess regions with a conductive material. The conductive pads D may be doped with an impurity whose conductivity is different from that of the vertical pillars VP under the conductive pads D. Hence, the conductive pads D and their underlying regions may constitute diodes.

Figure 12A:
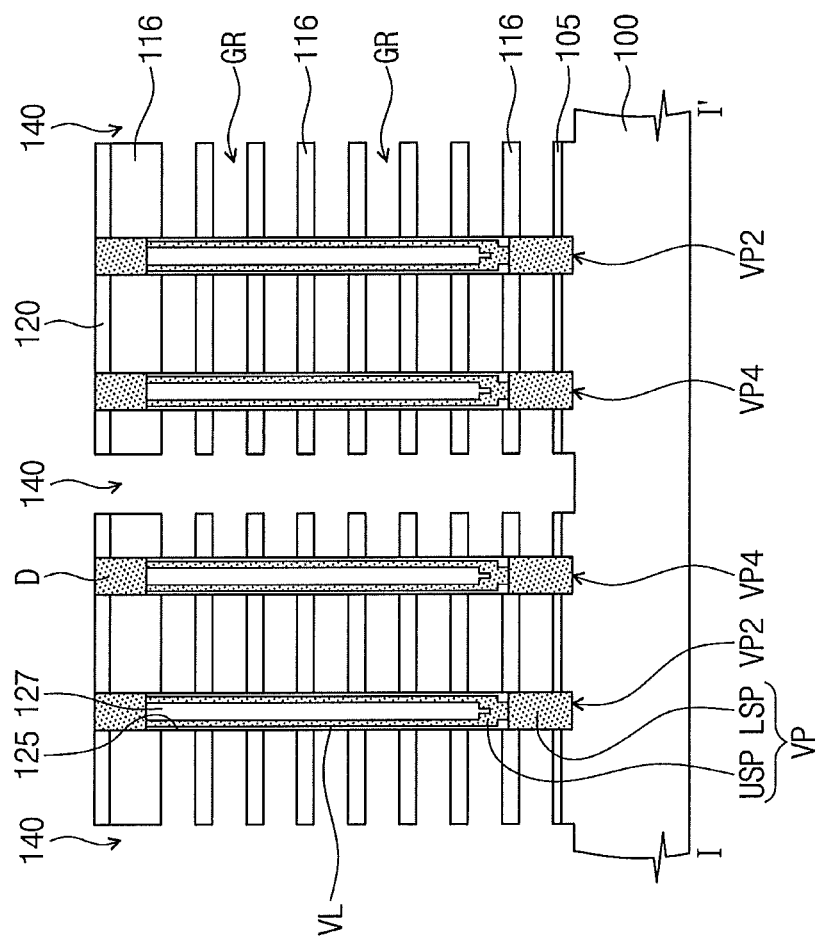
Figure 12B:
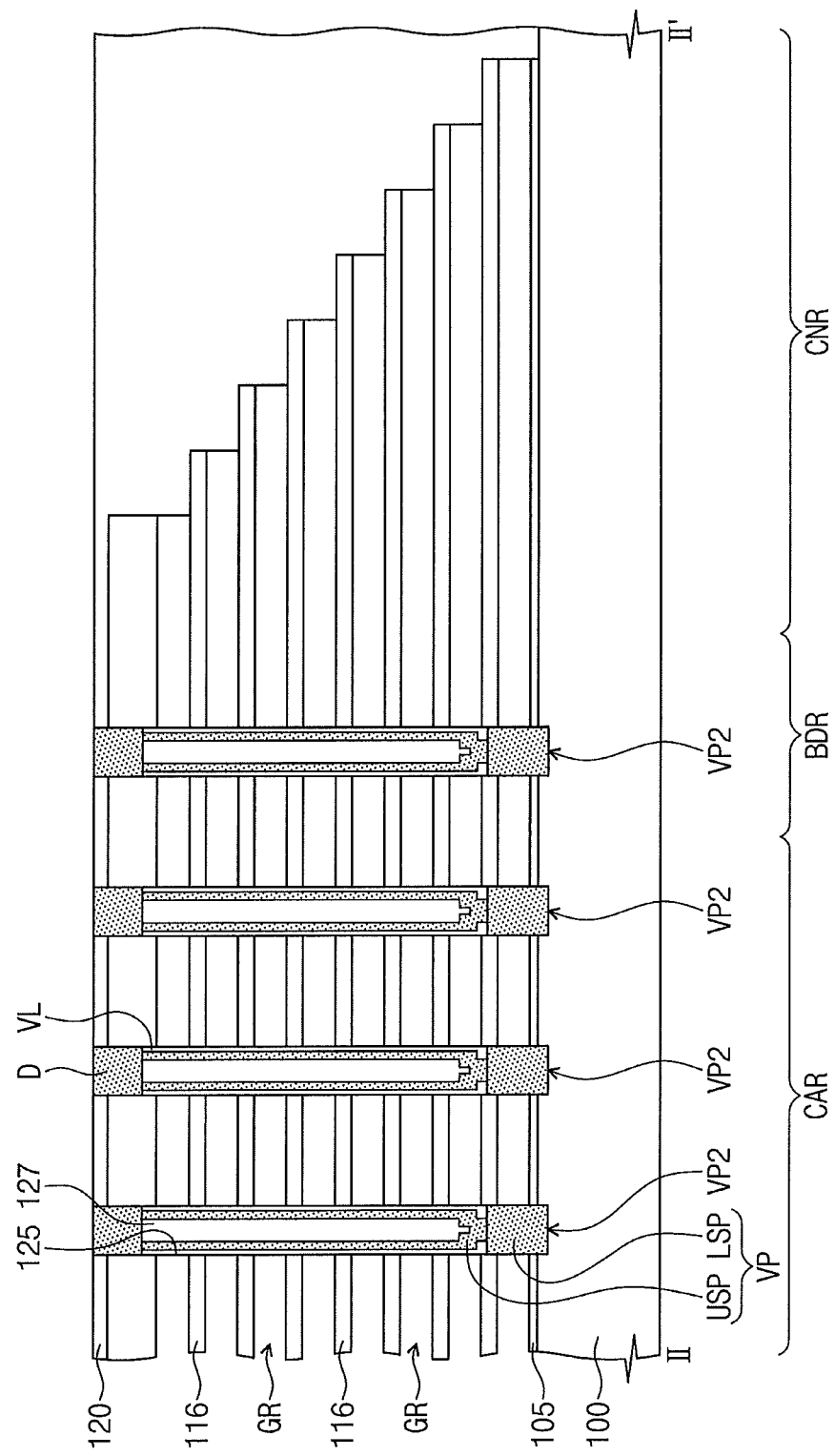

Referring to FIGS. 3, 12A, and 12B, the thin-layer structure 110 may be patterned to form a first separation region 140 through which the substrate 100 is exposed. For example, the patterning of the thin-layer structure 110 may include forming a mask pattern on the thin-layer structure 110 and then using the mask pattern as an etch mask to etch the buffer insulation layer 105, the sacrificial layers 112, and the insulation layers 114. The first separation region 140 may be formed to have a trench shape extending in the first direction D1. During the formation of the first separation region 140, an over-etching may be performed on the substrate 100 such that its top surface exposed through the first separation region 140 may be recessed to a predetermined depth. The patterned insulation layers 114 may be referred to hereinafter as insulation patterns 116.

The sacrificial layers 112 exposed to the first separation region 140 may be removed to form gate regions GR between the insulation patterns 116. The gate regions GR may be formed by selectively removing the sacrificial layers 112 between the insulation patterns 116. An isotropic etching process may be used to selectively remove the sacrificial layers 112. In some embodiments, when the sacrificial layers 112 include a silicon nitride layer and the insulation patterns 116 include a silicon oxide layer, the isotropic etching process may be performed using an etchant that includes phosphoric acid. The gate regions GR may horizontally extend between the insulation patterns 116 from the first separation region 140, and may expose a sidewall of the vertical insulation layer VL. The gate regions GR may be defined by the insulation patterns 116 vertically adjacent to each other and the sidewall of the vertical insulation layer VL.

Figure 13A:
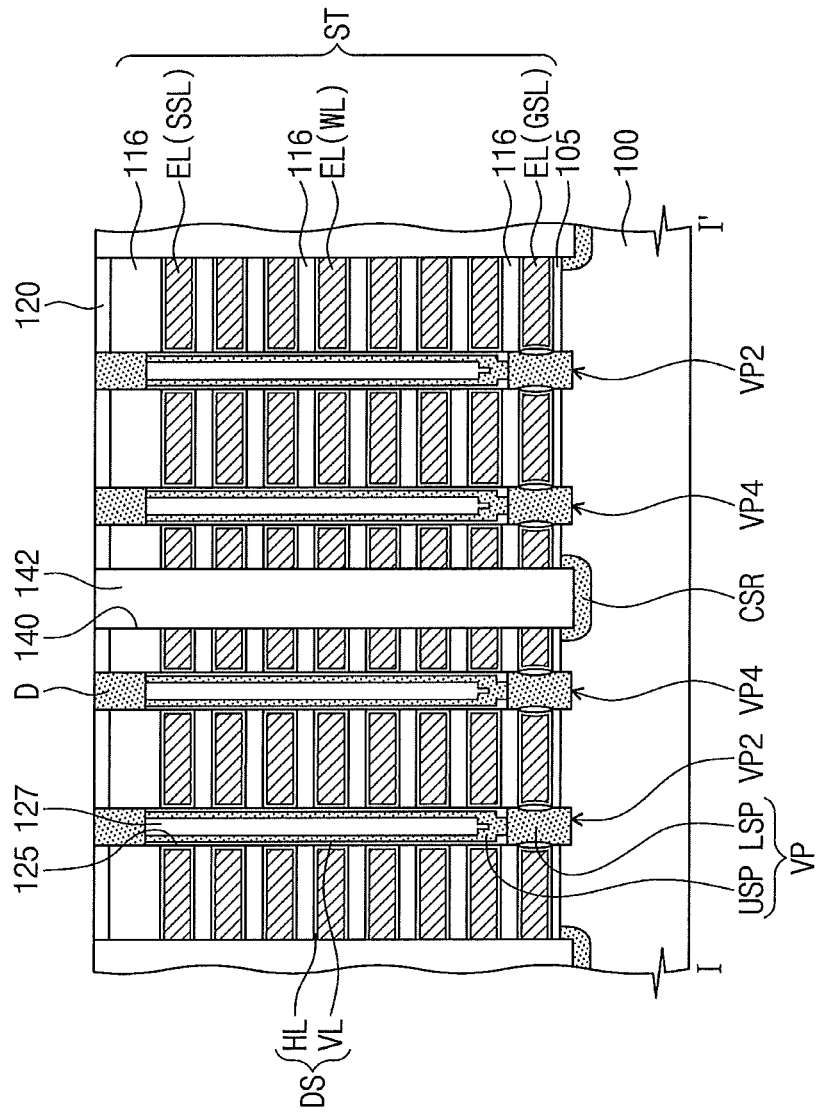
Figure 13B:
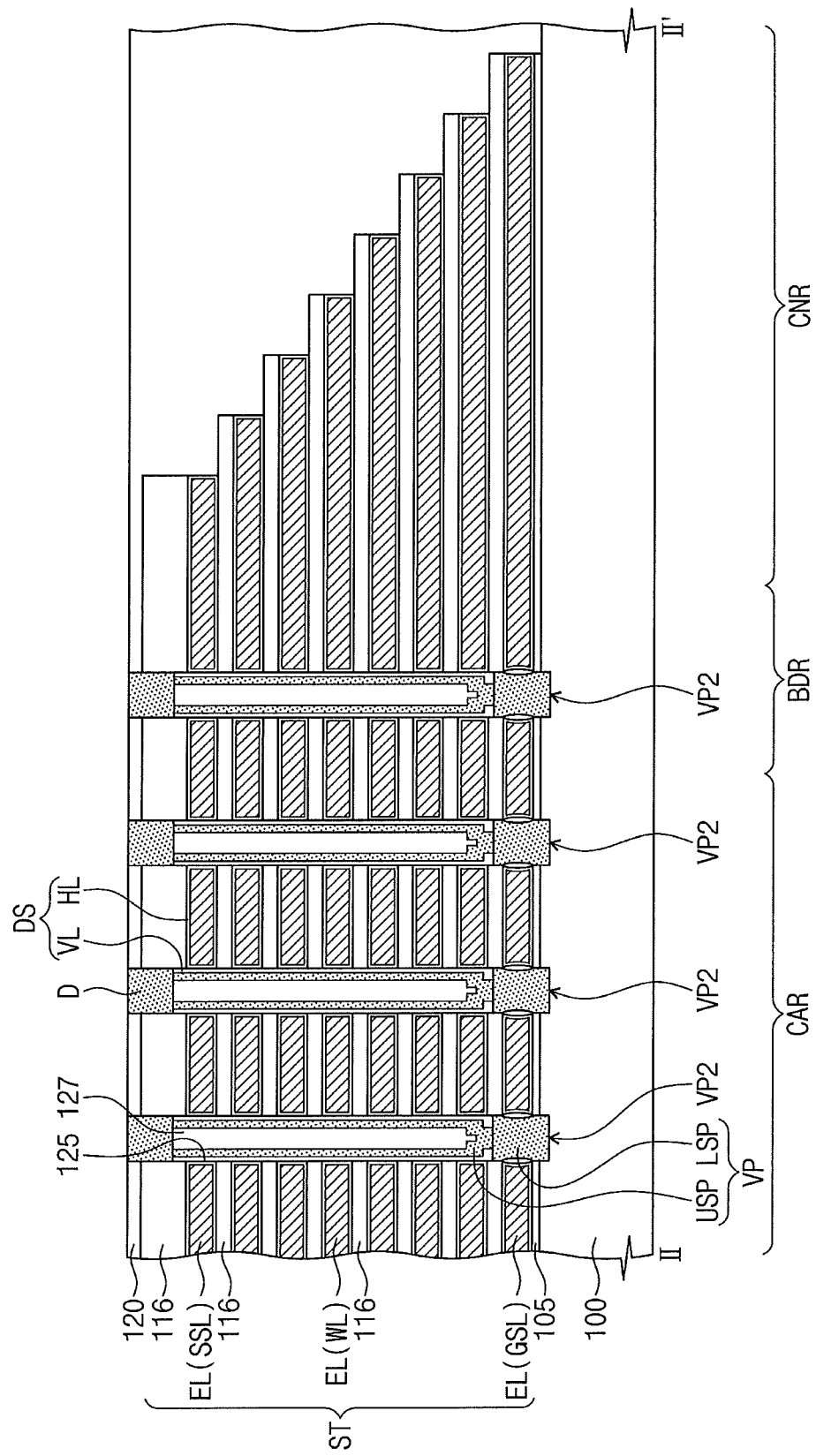

Referring to FIGS. 3, 13A, and 13B, a gate dielectric layer GD (e.g., a silicon oxide layer or a silicon-germanium oxide layer) may be formed by thermal oxidation performed on the lower semiconductor pattern LSP exposed to a lowermost gate region GR.

Gate electrodes EL may be formed in the gate regions GR. For example, the gate electrodes EL may be formed by providing a conductive material through the first separation region 140 to form a first conductive layer in the gate regions GR and then partially removing the first conductive layer from the first separation region 140. The first conductive layer may include one or more of polysilicon, metal (e.g., tungsten), and conductive metal nitride (e.g., titanium nitride, tantalum nitride, or tungsten nitride). The first conductive layer may be formed by atomic layer deposition. In some embodiments, before the formation of the first conductive layer, a horizontal insulation layer HL may be formed to conformally cover inner sidewalls of the gate regions GR. For example, the horizontal insulation layer HL may be formed of a high-k dielectric layer such as an aluminum oxide layer and/or a hafnium oxide layer.

Since the gate electrodes EL are formed in the gate regions GR, stack structures ST may be formed to include the insulation patterns 116 and the gate electrodes EL alternately and repeatedly stacked on the substrate 100. The stack structures ST may extend in the first direction D1 and may be spaced apart from each other in the second direction D2. Common source regions CSR may be formed in the substrate 100 between the stack structures ST. The common source regions CSR may be formed by doping the substrate 100 with an impurity whose conductivity is different from that of the substrate 100. The common source regions CSR may extend in the first direction D1.

A first separating insulation layer 142 may be formed in each of the first separation regions 140. For example, the first separating insulation layer 142 may be formed of a silicon oxide layer. Common source plugs 144 may be formed in the first separation regions 140 to thereby be coupled to the common source regions CSR. The common source plugs 144 may penetrate the first separating insulation layers (see 142 of FIG. 4C).

Figure 14A:
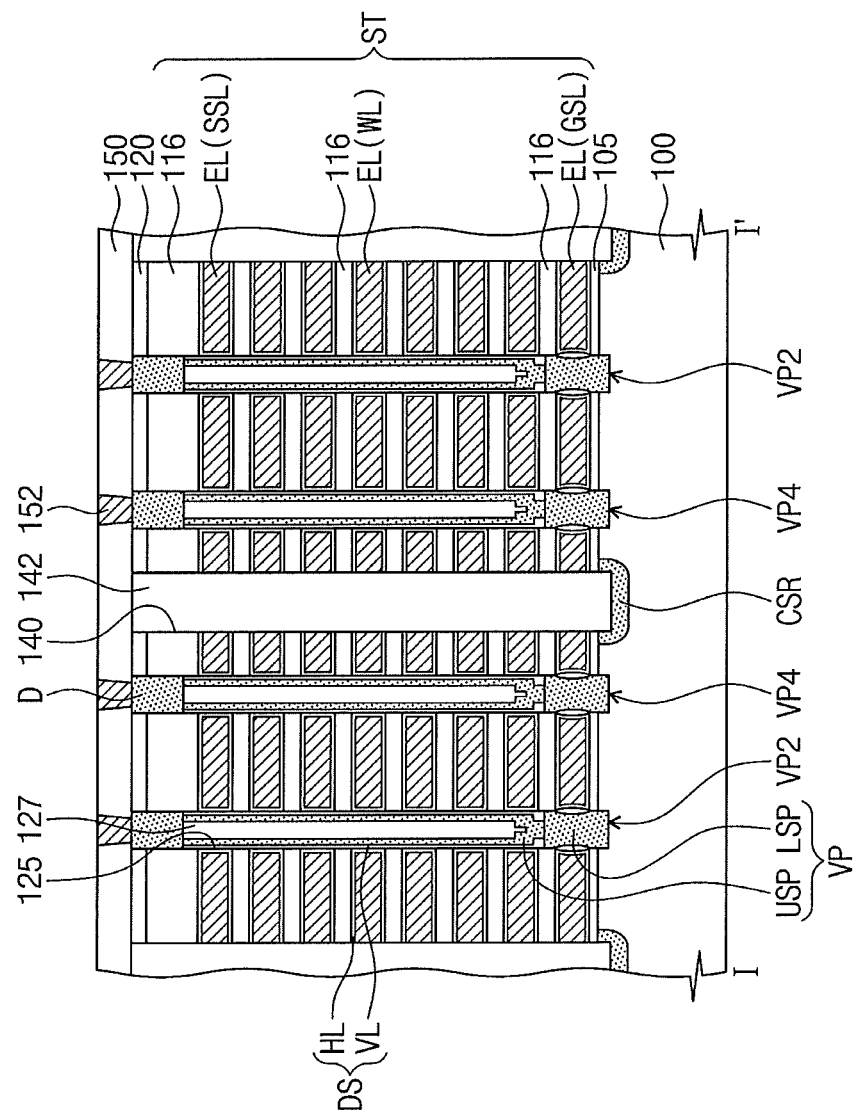
Figure 14B:
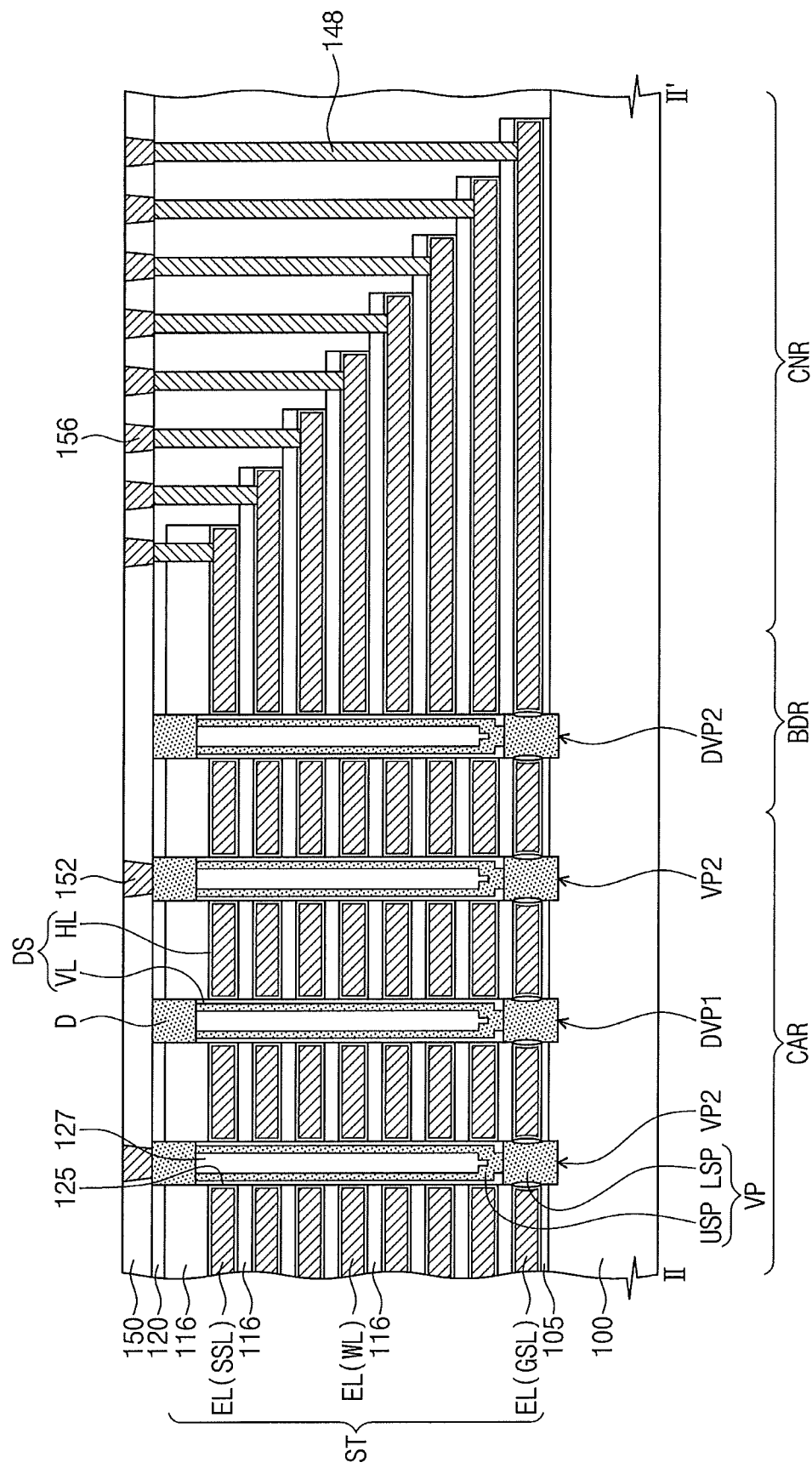

Referring to FIGS. 3, 14A, and 14B, contact plugs 148 may be formed to penetrate the buried insulation layer 120 to thereby be coupled to end portions of the gate electrodes EL. The contact plugs 148 may be obtained by forming contact holes to penetrate the buried insulation layer 120 and expose the end portions of the gate electrodes EL and then filling the contact holes with a conductive material (e.g., tungsten).

A first interlayer dielectric layer 150 may be formed on the buried insulation layer 120, and lower contacts 152, 154, and 156 may be formed in the first interlayer dielectric layer 150. The lower contacts 152, 154, and 156 may include bit line lower contacts 152 coupled to the vertical pillars VP, first lower contacts (see 154 of FIG. 4C) coupled to the common source plugs 144, and second lower contacts 156 coupled to the contact plugs 148. In some embodiments, a damascene process may be performed to form the lower contacts 152, 154, and 156. Ones of the vertical pillars VP may be dummy vertical pillars DVP1 and DVP2 without the bit line lower contacts 152 formed thereon.

Figure 15A:
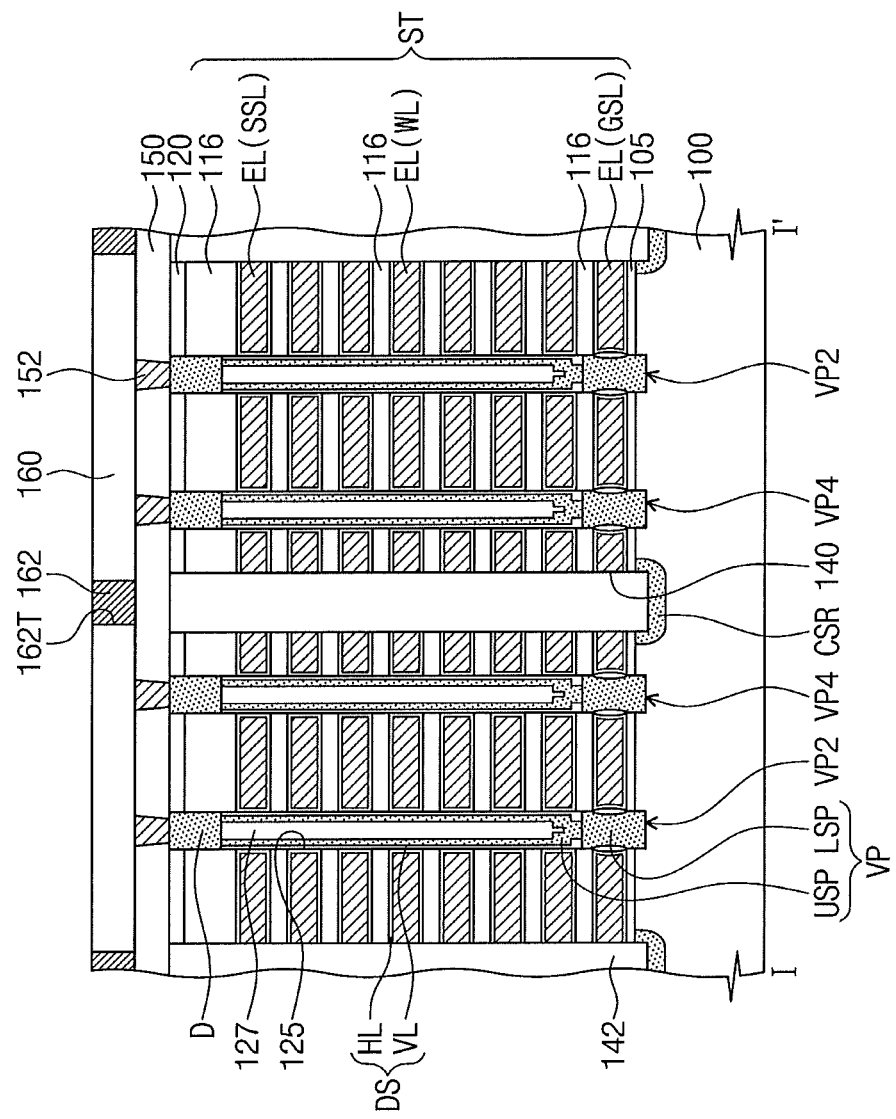
Figure 15B:
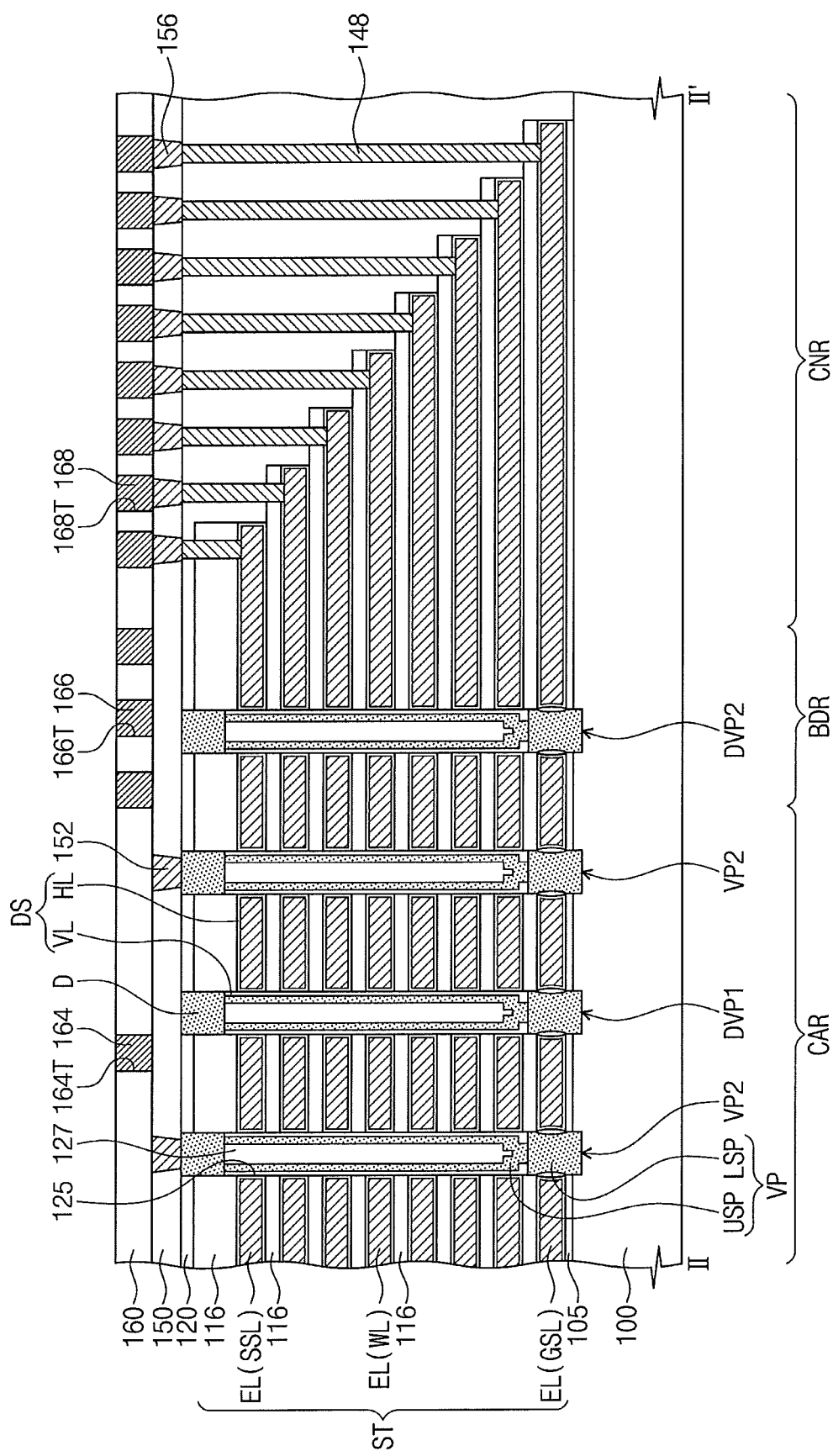

Referring to FIGS. 3, 15A, and 15B, a second interlayer dielectric layer 160 may be formed on the first interlayer dielectric layer 150, and then dummy lines 162, 164, and 166 and lower lines 168 may be formed in the second interlayer dielectric layer 160. The dummy lines 162, 164, and 166 may include a first cell dummy line 162, a second cell dummy line 164, and a peripheral dummy line 166. Shapes and arrangement of the dummy lines 162, 164, and 166 and the lower lines 168 are discussed above with reference to FIGS. 3 and 4A to 4C, and thus a detailed description thereof will be omitted.

A damascene process may be performed to form the dummy lines 162, 164, and 166 and the lower lines 168. In detail, the formation of the dummy lines 162, 164, and 166 and the lower lines 168 may include forming dummy line trenches 162T, 164T, and 166T and lower line trenches 168T in the second interlayer dielectric layer 160, forming in the second interlayer dielectric layer 160 a second conductive layer filling the dummy line trenches 162T, 164T, and 166T and the lower line trenches 168T, and planarizing the second conductive layer until exposing a top surface of the second interlayer dielectric layer 160. The dummy line trenches 162T, 164T, and 166T may include a first cell dummy line trench 162T in which the first cell dummy line 162 is formed, a second cell dummy line trench 164T in which the second cell dummy line 164 is formed, and a peripheral dummy line trench 166T in which the peripheral dummy line 166 is formed. The second conductive layer may include one or more of metal (e.g., tungsten or copper) and conductive metal nitride (e.g., titanium nitride, tantalum nitride, or tungsten nitride). The planarization of the second conductive layer may be achieved by performing, for example, CMP. During the planarization (e.g., CMP) of the second conductive layer, the dummy lines 162, 164, and 166 may minimize or reduce occurrence of failure (e.g., dishing) caused by a difference in pattern density between the cell array region CAR, the boundary region BDR, and the connection region CNR.

Referring back to FIGS. 3 and 4A to 4C, a third interlayer dielectric layer 170 may be formed on the second interlayer dielectric layer 160, and upper contacts 172, 174, and 176 may be formed in the third interlayer dielectric layer 170. The upper contacts 172, 174, 176 may include bit line upper contacts 172 coupled to the bit line lower contacts 152, first upper contacts 174 coupled to the second cell dummy lines 164, and second upper contacts 176 coupled to the lower lines 168. The bit line lower contacts 152 may penetrate the third interlayer dielectric layer 170 and extend into the second interlayer dielectric layer 160. Likewise the lower contacts 152, 154, 156, and 158, a damascene process may be employed to form the upper contacts 172, 174, and 176.

The third interlayer dielectric layer 170 may be provided thereon with bit lines BL1 and BL2 coupled to the bit line upper contacts 172, a common source line CSL coupled to the first upper contacts 174, and upper lines 180 coupled to the second upper contacts 176. A semiconductor device of FIGS. 3 and 4 may be manufactured through the processes mentioned above.

Figure 16:
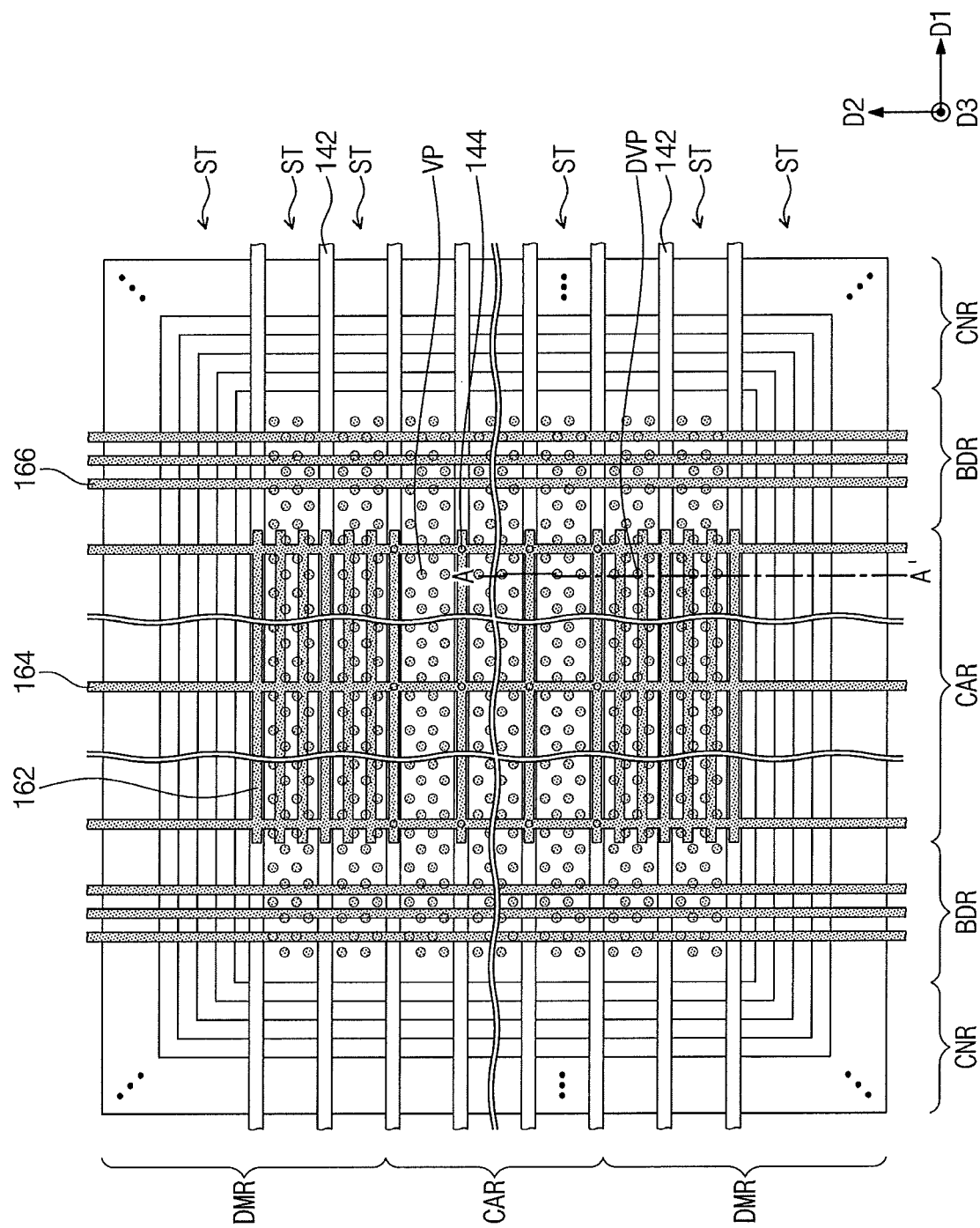
FIGS. 16 and 18 are plan views of a semiconductor device according to exemplary embodiments of the present inventive concept.
Figure 17:
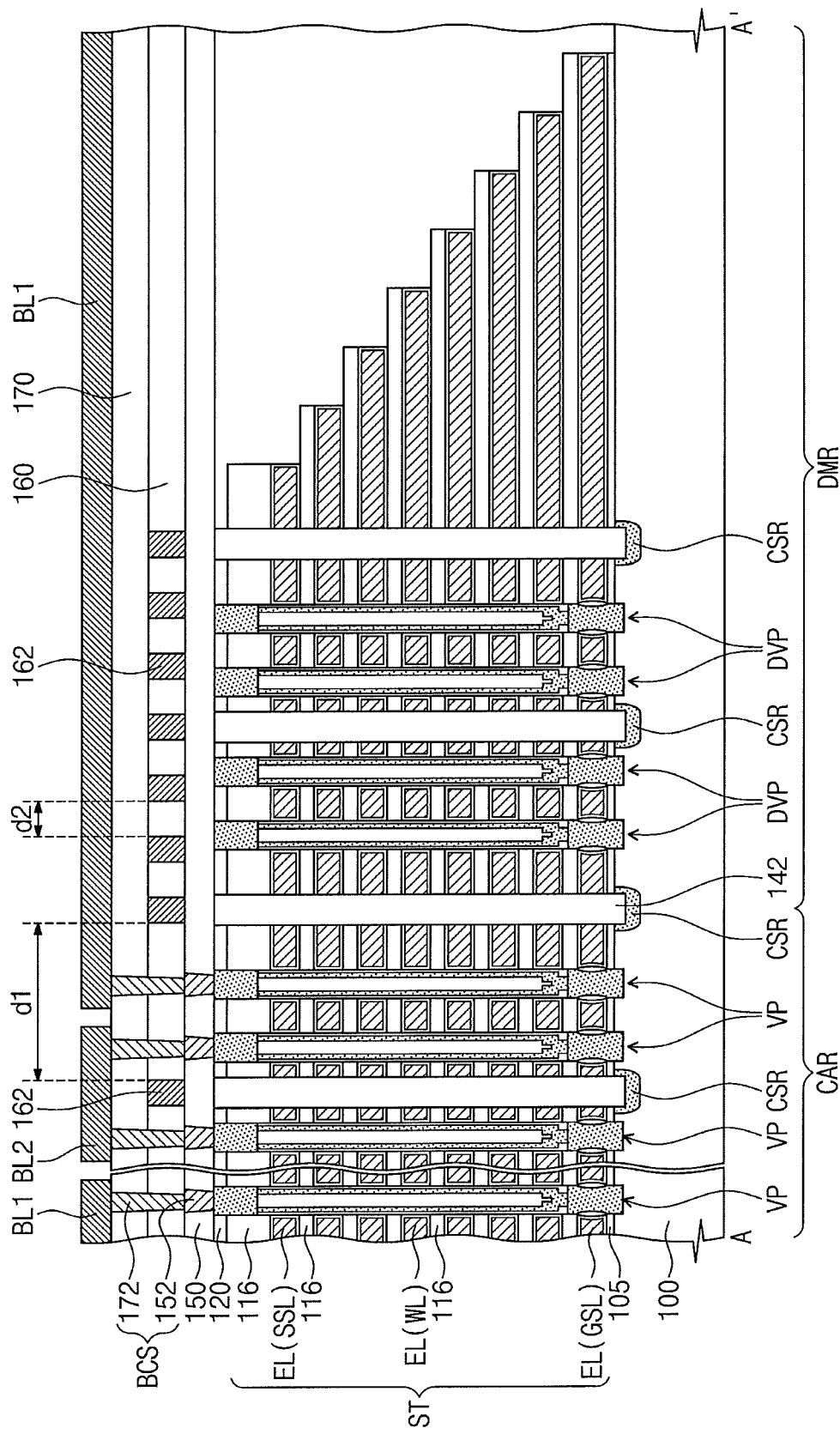
FIG. 17 is a cross-sectional view taken along line A-A' of FIG. 16 according to an exemplary embodiment.
Figure 18:
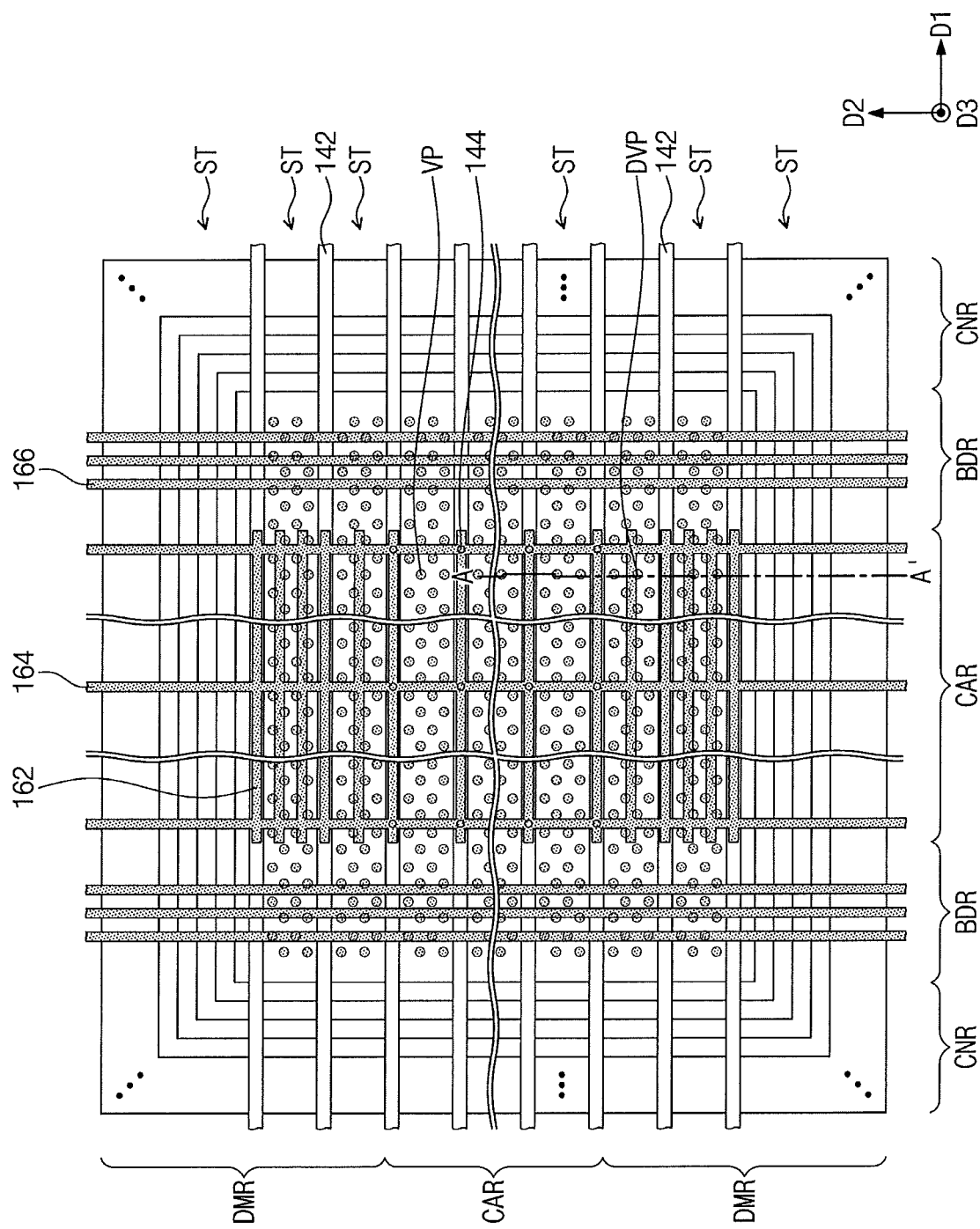
Figure 19:
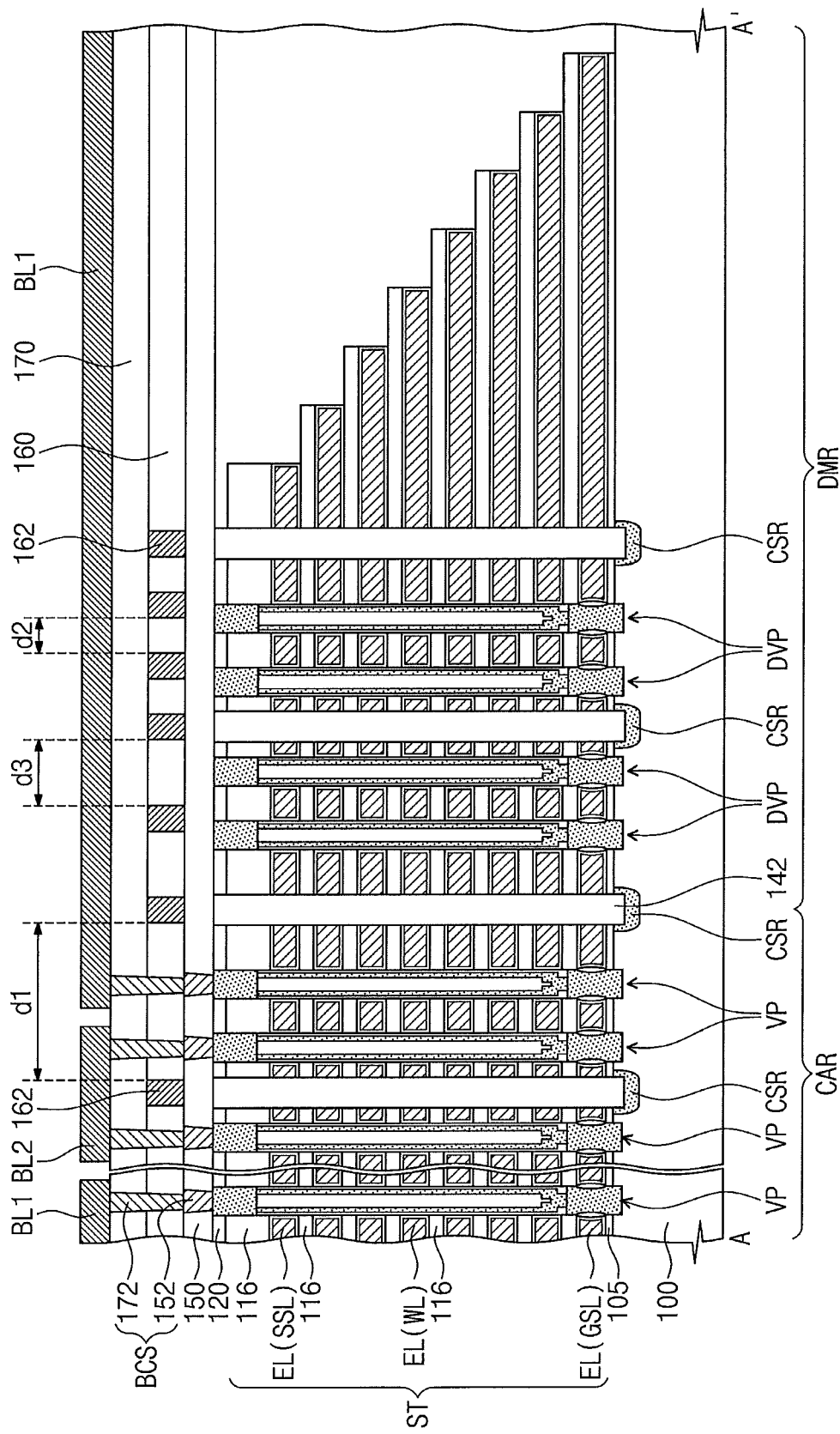
FIG. 19 is a cross-sectional view taken along line A-A' of FIG. 18 according to an exemplary embodiment.

FIGS. 16 and 18 are plan views of a semiconductor device according to exemplary embodiments of the present inventive concept. FIG. 17 is a cross-sectional view taken along line A-A' of FIG. 16, and FIG. 19 is a cross-sectional view taken along line A-A' of FIG. 18. For brevity of the description, a detailed explanation will be omitted on the same technical features as those of the semiconductor device discussed above with reference to FIGS. 3, 4A to 4C, and 5A.

Referring to FIGS. 16 and 17, a substrate 100 may include a cell array region CAR, connection regions CNR at opposite sides of the cell array region CAR in a first direction D1, boundary regions BDR between the cell array region CAR and each of the connection regions CNR, and dummy regions DMR at opposite sides of the cell array region CAR in a second direction D2.

Stack structures ST may be disposed on the substrate 100. The stack structures ST may extend along the first direction D1 and may be arranged along the second direction D2 crossing the first direction D1. Each of the stack structures ST may include insulation patterns 116 and gate electrodes EL vertically and alternately stacked on the substrate 100. The gate electrodes EL may include a ground select line GSL, word lines WL, and a string select line SSL. The stack structures ST adjacent to each other may be provided therebetween with a first separating insulation layer 142 extending in the first direction D1.

The stack structures ST may extend from the cell array region CAR toward the connection region CNR, and may each have on the connection region CNR a stepwise structure either in the first direction D1 or in a direction opposite to the first direction D1. For example, on the connection region CNR, the gate electrodes EL may have sidewalls spaced apart from each other, and areas of the gate electrodes EL may decrease with increasing vertical heights of the gate electrodes EL. In addition, an outermost one of the stack structures ST may have a stepwise structure either in the second direction D2 or in a direction opposite to the second direction D2.

Each of the stack structures ST may be penetrated with vertical pillars VP connected to the substrate 100. The vertical pillars VP may include a semiconductor material or a conductive material. As viewed in plan, the vertical pillars VP may be arranged in a zigzag fashion either in the first direction D1 or in the second direction D2. The vertical pillars VP (except for dummy vertical pillars close to a common source line CSL, in a plan view, as like that shown in FIG. 3) of the cell array region CAR may be connected through bit line contact structures BCS to bit lines BL1 and BL2. Alternatively, vertical pillars on the boundary and dummy regions BDR and DMR may not be connected to the bit lines BL1 and BL2. That is, the vertical pillars of the boundary and dummy regions BDR and DMR may be dummy vertical pillars DVP. For example, the dummy vertical pillars DVP may not be provided thereon with bit line lower contacts 152 or bit line upper contacts 172. The vertical pillars VP may be connected through the bit line contact structures BCS to the bit lines BL1 and BL2.

The cell array region CAR, the boundary regions BDR, and dummy regions DMR may be provided thereon with a second interlayer dielectric layer 160 having therein first cell dummy lines 162, second cell dummy lines 164, and peripheral dummy lines 166. On the cell array region CAR and the dummy regions DMR, the first cell dummy lines 162 may extend in the first direction D1 and may be disposed spaced apart from each other in the second direction D2. The first cell dummy lines 162 on the cell array region CAR may be disposed on first separating insulation layers 142 between the stack structures ST. The first cell dummy lines 162 on the dummy regions DMR may also be disposed on the stack structures ST between neighboring first separating insulation layers 142 as well as on the first separating insulation layers 142. The first cell dummy lines 162 on the cell array region CAR may be spaced apart from each other at an interval different from that of the first cell dummy lines 162 on the dummy regions DMR. For example, the first cell dummy lines 162 on the cell array region CAR may be spaced apart from each other at a first spacing d1 greater than a second spacing d2 of the first cell dummy lines 162 on the dummy regions DMR. In other words, a pattern density of the first cell dummy lines 162 may be greater at the dummy regions DMR than at the cell array region CAR.

In other embodiments, as shown in FIGS. 18 and 19, the first cell dummy lines 162 on the dummy regions DMR may be spaced apart from each other at an interval that increases stepwise with approaching the cell array region CAR. For example, the first cell dummy lines 162 on an outermost stack structure ST may be spaced apart from each other at a second spacing d2 less than a third spacing d3 of the first cell dummy lines 162 on other stack structure ST adjacent to the cell array region CAR. In other words, the first cell dummy lines 162 may have a pattern density that decreases stepwise with approaching the cell array region CAR.

The second cell dummy lines 164 may be disposed along the first direction D1, and may extend along the second direction D2 to run across the first cell dummy lines 162 on the cell array and dummy regions CAR and DMR. Each of the second cell dummy lines 164 may partially overlap each of the first cell dummy lines 162. On the cell array region CAR and the dummy regions DMR, the first and second cell dummy lines 162 and 164 may constitute a lattice or grid structure. The peripheral dummy lines 166 on the boundary region BDR may be disposed along the first direction D1, and may extend along the second direction D2 to run across the cell array region CAR and the dummy regions DMR.

Other configurations may be identical or similar to those discussed with reference to FIGS. 3, 4A to 4C, and 5A. Although not shown in figures, the embodiments of FIGS. 5B and 6A to 6D may also be applicable to the current embodiments of FIGS. 17 to 19.

According to embodiments of the present inventive concepts, the vertical pillars may be directly connected through the bit line contact structures to the bit lines. A single bit line may be connected in common through corresponding bit line contact structures to a pair of the vertical pillars, which are spaced apart from each other in an extending direction of the bit lines and each of which is coupled to its corresponding one of the string select lines. The dummy lines may be formed on a region where the bit line contact structures are not formed, such that it may be possible to minimize or reduce occurrence of failure caused by a difference in pattern density. As a result, there may be provided a semiconductor device having enhanced reliability and high integration.

Although exemplary embodiments of the present inventive concept have been discussed with reference to accompanying figures, it will be understood that various changes in form and details may be made therein without departing from the spirit and scope of the present inventive concept.

What is claimed is:

1. A semiconductor device, comprising:
   a plurality of stack structures that include gate electrodes sequentially stacked on a substrate and disposed along a first direction parallel to a top surface of the substrate;
   a plurality of separating insulation layers each of which is disposed between the stack structures separating the gate electrodes of the stack structures adjacent to each other in the first direction;
   a plurality of vertical pillars that penetrate each of the stack structures and are connected to the substrate;
   a plurality of bit lines that are disposed on the vertical pillars and run across the stack structures in the first direction;
   a plurality of bit line contact structures that connect the vertical pillars to the bit lines; and
   a plurality of first cell dummy lines that are disposed on the plurality of separating insulation layers and extend in a second direction crossing the first direction,
   wherein each of the bit line contact structures comprises:
   a bit line lower contact coupled to its underlying vertical pillar; and
   a bit line upper contact directly connecting the bit line lower contact,
   wherein the first cell dummy lines have top surfaces higher than a top surface of the bit line lower contact and lower than a top surface of the bit line upper contact.

2. The semiconductor device of claim 1, wherein the top surface of the bit line upper contact has a first center that is offset from a second center of a top surface of the vertical pillar under the bit line upper contact.

3. The semiconductor device of claim 2, wherein the first center is shifted from the second center in the second direction or in a direction opposite to the second direction.

4. The semiconductor device of claim 1, wherein the bit line upper contact has a planar elliptical shape having a major axis in the first direction and a minor axis in the second direction and has a vertical length greater than a vertical length of the bit line lower contact.

5. The semiconductor device of claim 1, further comprising a second cell dummy line that extends in the first direction and is connected to each of the first cell dummy lines.

6. The semiconductor device of claim 5, wherein the second cell dummy line comprises protrusions that protrude in the second direction or in a direction opposite to the second direction from opposite sidewalls of the second cell dummy line,
   wherein the most adjacent ones of the protrusions protrude in opposite directions.

7. The semiconductor device of claim 5, further comprising:
   a plurality of common source regions in the substrate under the plurality of separating insulation layers; and
   a plurality of common source plugs that penetrate the plurality of separating insulation layers and are coupled to the common source regions, the common source plugs being disposed along the first direction,
   wherein the second cell dummy line is electrically connected in common to the common source plugs.

8. The semiconductor device of claim 5, further comprising a plurality of peripheral dummy lines disposed along the second direction and spaced apart from the first and second cell dummy lines,
   wherein the first and second cell dummy lines and the peripheral dummy lines have top surfaces at substantially the same height.

9. The semiconductor device of claim 1, wherein
   the bit lines comprise first bit lines and second bit lines that are alternately and repeatedly disposed along the second direction,
   the vertical pillars comprise first to fourth vertical pillars that are disposed in a zigzag fashion along the first direction or along a direction opposite to the first direction,
   one of the first bit lines is electrically connected in common to a pair of the first vertical pillars that are spaced apart from each other in the first direction and each penetrates a corresponding one of the stack structures, and
   one of the second bit lines is electrically connected in common to a pair of the third vertical pillars that are spaced apart from each other in the first direction and each penetrates a corresponding one of the stack structures, the one of the second bit lines being adjacent to the one of the first bit lines.

10. A semiconductor device, comprising:
    a substrate including a cell array region and a dummy region;
    a plurality of stack structures that include gate electrodes vertically stacked on the substrate, the plurality of stack structures being disposed along a first direction and extending in a second direction crossing the first direction;

a plurality of vertical pillars that penetrate each of the stack structures and are connected to the substrate;

a plurality of bit lines running across the stack structures in the first direction;

a plurality of bit line contact structures disposed on the vertical pillars penetrating the stack structures on the cell array region; and a plurality of cell dummy lines that are disposed between the stack structures and the bit lines and constitute a grid structure while not overlapping the bit line contact structures in a plan view.

11. The semiconductor device of claim 10, wherein the cell dummy lines comprise:

a plurality of first cell dummy lines that are disposed along the first direction and extend along the second direction; and a plurality of second cell dummy lines that are disposed along the second direction and extend along the first direction, the second cell dummy lines partially overlapping the first cell dummy lines.

12. The semiconductor device of claim 11, wherein first cell dummy lines comprise cell dummy lines on the cell array region that are spaced apart from each other at a first spacing and cell dummy lines on the dummy region that are spaced apart from each other at a second spacing, the first spacing being greater than the second spacing.

13. The semiconductor device of claim 10, wherein each of the bit line contact structures comprises:

a bit line lower contact coupled to its underlying vertical pillar; and a bit line upper contact directly connecting the bit line lower contact to its corresponding bit line, wherein the bit line upper contact has a top surface whose first center is shifted in the second direction or in a direction opposite to the second direction from a second center of a top surface of the vertical pillar under the bit line upper contact.

14. The semiconductor device of claim 10, wherein the dummy region is positioned at a side of the cell array region in the first direction, and the substrate further comprises a connection region positioned at another side of the cell array region in the second direction and a boundary region between the cell array region and the connection region, the semiconductor device further comprising a plurality of peripheral dummy lines that are disposed along the second direction on the boundary region and extend along the first direction while running across the cell array region and the dummy region, wherein the cell dummy lines and the peripheral dummy lines have top surfaces at substantially the same height.

15. A semiconductor device, comprising:

a substrate including a cell array region, a connection region and a boundary region between the cell array region and the connection region;

a plurality of stack structures that include gate electrodes vertically stacked on the substrate;

a plurality of vertical pillars that penetrate each of the stack structures and are connected to the substrate;

a plurality of bit lines disposed on the stack structures on the cell array region;

conductive lines positioned at a level higher than each of the stack structures and a level lower than the bit lines, the conductive lines comprising cell dummy lines on the cell array region, peripheral dummy lines on the boundary region, and conductive lower lines on the connection region; and a plurality of bit line contact structures that connect the vertical pillars on the cell array region to the bit lines, each of the bit lines contact structures comprising:

a bit line lower contact coupled to its underlying vertical pillar; and a bit line upper contact directly connecting the bit line lower contact to its corresponding bit line, wherein the cell dummy lines, the peripheral dummy lines and the conductive lower lines have top surfaces higher than a top surface of the bit line lower contact and lower than a top surface of the bit line upper contact.

16. The semiconductor device of claim 15, wherein the stack structures extend in a first direction extending from the cell array region toward the connection region and disposed along a second direction crossing the first direction, wherein the cell dummy lines comprise:

first cell dummy lines that are disposed between adjacent ones of the stack structures and extend in the first direction in a plan view; and second cell dummy lines that are disposed along the first direction and extend along the second direction, the second cell dummy lines partially overlapping the first cell dummy lines, and wherein the peripheral dummy lines are disposed along the first direction and extend along the second direction.

17. The semiconductor device of claim 15, wherein the top surface of the bit line upper contact has a first center that is offset from a second center of a top surface of the vertical pillar under the bit line upper contact.

18. The semiconductor device of claim 15, wherein each of the stack structures have a stepwise structure on the connection region, and the semiconductor device further comprising contact plugs coupled to end portions of the gate electrodes of each of the stack structures, the contact plugs being electrically connected to the conductive lower lines.

* * * * *